(12) United States Patent
Clark et al.

(10) Patent No.: US 11,398,379 B2
(45) Date of Patent: Jul. 26, 2022

(54) PLATFORM AND METHOD OF OPERATING FOR INTEGRATED END-TO-END SELF-ALIGNED MULTI-PATTERNING PROCESS

(71) Applicant: Tokyo Electron Limited, Tokyo (JP)

(72) Inventors: Robert Clark, Albany, NY (US);
Richard Farrell, Albany, NY (US);
Kandabara Tapily, Albany, NY (US);
Angelique Raley, Albany, NY (US);
Sophie Thibaut, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 320 days.

(21) Appl. No.: 16/356,465

(22) Filed: Mar. 18, 2019

(65) Prior Publication Data

US 2019/0295906 A1    Sep. 26, 2019

Related U.S. Application Data

(60) Provisional application No. 62/645,685, filed on Mar. 20, 2018, provisional application No. 62/784,151, (Continued)

(51) Int. Cl.
*H01L 21/66* (2006.01)
*H01L 21/033* (2006.01)
(Continued)

(52) U.S. Cl.
CPC ...... *H01L 21/0337* (2013.01); *H01L 21/3086* (2013.01); *H01L 21/67069* (2013.01);
(Continued)

(58) Field of Classification Search
CPC ......... H01L 21/67196; H01L 21/67207; H01L 21/67253; H01L 21/67703; H01L 22/12; H01L 22/26
See application file for complete search history.

(56) References Cited

U.S. PATENT DOCUMENTS 5,612,068 A * 3/1997 Kempf ............ H01L 21/67161
414/223.01
6,736,149 B2 * 5/2004 Biberger ........... H01L 21/67167
134/102.2
(Continued)

FOREIGN PATENT DOCUMENTS

KR    10 2016 0132048    11/2016

OTHER PUBLICATIONS

International Search Report and Written Opinion of the International Searching Authority issued in PCT/US2019/022719, filed Mar. 18, 2019, 11 pages.

*Primary Examiner* — Nicholas J Tobergte
(74) *Attorney, Agent, or Firm* — Oblon, McClelland, Maier & Neustadt, L.L.P.

(57) ABSTRACT

A method is provided for self-aligned multi-patterning on a semiconductor workpiece using an integrated sequence of processing steps executed on a common manufacturing platform hosting one or more film-forming modules, one or more etching modules, and one or more transfer modules. A workpiece having a mandrel pattern formed thereon is received into the common manufacturing platform. A sidewall spacer pattern is formed based, at least in part, on the mandrel pattern, the sidewall spacer pattern having a plurality of second features separated by a second pitch distance with the first pitch distance being greater than the second pitch distance. The integrated sequence of processing steps is executed within the common manufacturing platform without leaving the controlled environment and the transfer modules are used to transfer the workpiece between the processing modules while maintaining the workpiece within the controlled environment. Broadly, forming a sidewall spacer pattern based on the mandrel pattern.

19 Claims, 11 Drawing Sheets

Related U.S. Application Data filed on Dec. 21, 2018, provisional application No. 62/787,607, filed on Jan. 2, 2019, provisional application No. 62/787,608, filed on Jan. 2, 2019, provisional application No. 62/788,195, filed on Jan. 4, 2019.

(51) Int. Cl.
  *H01L 21/308* (2006.01)
  *H01L 21/677* (2006.01)
  *H01L 21/67* (2006.01)

(52) U.S. Cl.
  CPC .. *H01L 21/67196* (2013.01); *H01L 21/67207* (2013.01); *H01L 21/67253* (2013.01); *H01L 21/67703* (2013.01); *H01L 22/12* (2013.01); *H01L 22/26* (2013.01)

(56) References Cited

U.S. PATENT DOCUMENTS

| | | | |
|---|---|---|---|
| 10,727,057 B2* | 7/2020 | Clark | H01L 21/67069 |
| 2007/0264106 A1* | 11/2007 | van der Meulen | H01L 21/6719 414/217 |
| 2010/0009470 A1 | 1/2010 | Davis et al. | |
| 2016/0225640 A1 | 8/2016 | Raley et al. | |
| 2016/0293438 A1 | 10/2016 | Zhou et al. | |
| 2016/0336178 A1* | 11/2016 | Swaminathan | H01L 21/0332 |
| 2017/0023357 A1 | 1/2017 | Turovets | |
| 2018/0061641 A1* | 3/2018 | Choi | H01L 21/67196 |
| 2019/0096673 A1* | 3/2019 | Lee | H01L 21/02664 |
| 2019/0295903 A1* | 9/2019 | Clark | H01L 21/0226 |
| 2020/0006100 A1* | 1/2020 | Clark | H01L 22/12 |

* cited by examiner

PLATFORM AND METHOD OF OPERATING FOR INTEGRATED END-TO-END SELF-ALIGNED MULTI-PATTERNING PROCESS

CROSS-REFERENCE TO RELATED APPLICATIONS

The present application claims the benefit of U.S. Provisional Application No. 62/645,685, filed on Mar. 20, 2018, entitled "Substrate Processing Tool with Integrated Metrology and Method of Using," U.S. Provisional Application No. 62/784,151, filed on Dec. 21, 2018 entitled "Platform and Method for Operating for Integrated End-to-End Self Aligned Multiple Patterning Process," U.S. Provisional Application No. 62/787,607, filed on Jan. 2, 2019, entitled "Self-Aware and Correcting Heterogeneous Platform incorporating Integrated Semiconductor Processing Modules and Method for using same," U.S. Provisional Application No. 62/787,608, filed on Jan. 2, 2019, entitled "Self-Aware and Correcting Heterogeneous Platform incorporating Integrated Semiconductor Processing Modules and Method for using same," and U.S. Provisional Application No. 62/788,195, filed on Jan. 4, 2019, entitled "Substrate Processing Tool with Integrated Metrology and Method of using," which is incorporated herein by reference in its entirety.

BACKGROUND OF THE INVENTION

Field of Invention

The present invention relates to a processing platform and methods for semiconductor processing using the platform, and more particularly to a method for self-aligned multi-patterning (SAMP).

Description of Related Art

SAMP techniques have been used for formation of components of fin-type field effect transistor (FinFET) devices, and the like. Dimension shrinkage is one of the driving forces in the development of integrated circuit processing. By reducing the size dimensions, cost-benefit and device performance boosts can be obtained. This scalability creates inevitable complexity in process flow, especially on patterning techniques. As smaller transistors are manufactured, the critical dimension (CD) or resolution of patterned features is becoming more challenging to produce, particularly in high volume. Self-aligned patterning needs to replace overlay-driven patterning so that cost-effective scaling can continue. Patterning options that enable reduced variability, extend scaling, and enhance CD and process control are needed in a high-volume manufacturing environment; however, it is getting extremely difficult to produce scaled devices at reasonably low cost and high yield.

Conventional SAMP flow has several steps, including mandrel (or core) formation, spacer deposition, spacer etch, and mandrel pull. In this approach, the final feature critical dimension (CD) is controlled by workpiece attributes, including spacer deposition thickness and spacer physical features, such as line edge roughness (LER) and line width roughness (LWR). Additionally, spacer etch often suffers distortion of the final spacer profile such as spacer facet and CD loss. It is important to sustain the spacer profile and CD because spacer profile has a substantial impact on pitch-walking effect, mask budget and CD targeting on the final structure. Further issues with processing techniques include spacer height loss due to non-uniform etch and lack of selectivity between the core material and the spacer material. Additionally, inadequate etch of spacer material may result in spacer footings, core-to-spacer step height differences, and the like. Such manufacturing defects may cause further device defects, reduce product production rates, limit the scale of manufactural devices, etc. With multiple operations in the SAMP process flow, temporal tool drift is a problem, specifically edge placement error (EPE) may exceed a permissible level. EPE is the difference between the intended design and the actual results and is defined as the sum of variations that induces placement error of blocking mask and process shift. EPE is represented by a numerical value, and a target EPE value is defined for a given process flow. In simple terms, EPE is equal to the combination of various metrics—CD uniformity, overlay, line-edge roughness (LER) and variation.

As devices are scaled to smaller and smaller features and techniques are implemented to try and address the issues that result from scaling, it is important to monitor the fabrication process at various stages of the process flow to determine whether the feature attributes are within specification, and if not, to adjust the process to either bring the workpiece within specification or to bring subsequently processed workpieces within specification.

In conventional SAMP, the process is performed using multiple separate stand-alone tools for high-volume manufacturing. Wafers are sequentially loaded into one tool, subjected to one process step in that tool, then removed to ambient environment and placed in queue to be loaded into the next tool, and so on until the multiple steps of the SAMP flow are complete. Time spent waiting in queue for each tool is referred to as Q-time, and high Q-times result in lower production rates. Different operations in the process flow may take different amounts of time such that throughput matching of tools is a production challenge.

Each tool in the process flow may be part of a tool cluster. For example, five identical etch tools can be clustered in combination with a transfer tool so that 5 wafers can be etched concurrently at one step of the process flow to enable high-volume production. The multiplicity of these cluster tools provides a benefit if a tool goes out of service for any reason. If 1 tool in a 5-tool cluster goes out of service for 1 week, then production can continue, albeit at only 80% capacity. Thus, each stand-alone tool in the SAMP flow may be a cluster of identical tools to prevent an out of service tool from shutting down production completely, and clustering may be used to minimize throughput matching challenges.

In conventional SAMP, if measurements are needed to determine whether the process is operating within specification, a stand-alone metrology tool may be included, where a workpiece is periodically removed from the process flow for measurements to be taken, which are often destructive measurements using a measurement pad on the workpiece, and the results can be fed back to the process flow tools for adjustments to downstream steps in the process flow, or adjustments to upstream steps for future wafers. This process involves exposure to the ambient environment, Q-time waiting for the metrology tool to be available, and lengthy measurement times for results to be obtained, such that significant time may pass before data is available to enable adjustments to be made to the process flow in either a feed-back or feed-forward manner. While real-time measurements of workpiece attributes taken in the process chamber would be ideal, exposure of the measurement devices to process gases is problematic, making real-time, in situ measurement and control logistically difficult or impossible.

Thus, the conventional approach of using multiple separate stand-alone tools (single or clustered) for high-volume manufacturing can lead to issues including but not limited to Q-time oxidation (i.e., as the wafers sit between tools waiting for their turn in the next tool, they can be subjected to oxidation from the ambient environment), defectivity from environmental exposure between tools, cost challenges due to throughput matching difficulties, temporal tool drift (e.g., EPE), real time chamber matching (e.g., yield and EPE), and lack of real-time workpiece measurement and process control. There is a need to address these and other issues to enable high-volume manufacturing with SAMP techniques.

SUMMARY OF THE INVENTION

According to embodiments, a method of self-aligned multi-patterning on a semiconductor workpiece is provided using an integrated sequence of processing steps executed on a common manufacturing platform hosting a plurality of processing modules including one or more film-forming modules, one or more etching modules, and one or more transfer modules. In one embodiment, the integrated sequence of processing steps includes receiving a workpiece into the common manufacturing platform, the workpiece having a mandrel pattern formed thereon comprising a number of features separated by a first pitch distance, and using the one or more film-forming modules and the one or more etching modules, forming a sidewall spacer pattern based, at least in part, on the mandrel pattern, the sidewall spacer pattern comprising a plurality of second features separated by a second pitch distance with the first pitch distance being greater than the second pitch distance. The integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

In another embodiment in which a workpiece having a mandrel pattern formed thereon comprising a number of mandrel lines is received into the common manufacturing platform, the integrated sequence of processing steps further includes conformally applying a first thin film over the mandrel pattern using a first film-forming module hosted on the common manufacturing platform and, without breaking vacuum, removing the first thin film from upper surfaces of the mandrel pattern and lower surfaces adjacent the mandrel pattern using a first etching module hosted on the common manufacturing platform to leave behind the first thin film on sidewalls of the mandrel pattern thereby forming first sidewall spacers. Then, without breaking vacuum, the mandrel pattern is removed from the workpiece using a second etching module hosted on the common manufacturing platform to leave behind the first sidewall spacers to thereby form a new feature pattern comprising a number of features that is double the number of mandrel lines. The one or more transfer modules are used to transfer the workpiece between the first film-forming module, the first etching module, and the second etching module without breaking vacuum.

In a related embodiment, the method is continued using the new feature pattern as another mandrel pattern. In the continued method, without breaking vacuum, a second thin film is conformally applied over the new feature pattern using a second film-forming module hosted on the common manufacturing platform. The continued method further includes, without breaking vacuum, removing the second thin film from upper surfaces of the new feature pattern and lower surfaces adjacent the new feature pattern using a third etching module hosted on the common manufacturing platform to leave behind the second thin film on sidewalls of the new feature pattern thereby forming second sidewall spacers, and without breaking vacuum, removing the second mandrel pattern from the workpiece using a fourth etching module hosted on the common manufacturing platform, to leave behind the second sidewall spacers, the number of second sidewall spacers being quadruple the number of mandrel lines.

In another embodiment in which a workpiece having a mandrel pattern formed thereon comprising a number of mandrel lines is received into the common manufacturing platform, the integrated sequence of processing steps further includes conformally applying a first thin film over the mandrel pattern using a first film-forming module hosted on the common manufacturing platform and, without breaking vacuum, removing the first thin film from upper surfaces of the mandrel pattern and lower surfaces adjacent the mandrel pattern using a first etching module hosted on the common manufacturing platform to leave behind the first thin film on sidewalls of the mandrel pattern thereby forming first sidewall spacers. Then, without breaking vacuum, a second thin film is conformally applied over the first sidewall spacers and mandrel pattern in a second film-forming module hosted on the common manufacturing platform, and again without breaking vacuum, the second thin film is removed from upper surfaces of the first sidewall spacers and mandrel pattern and lower surfaces adjacent the first sidewall spacers in a second etching module hosted on the common manufacturing platform to leave behind the second thin film on sidewalls of the first sidewall spacers thereby forming second sidewall spacers. Then, without breaking vacuum, the first sidewall spacers are removed from the workpiece using a third etching module hosted on the common manufacturing platform to leave behind the second sidewall spacers and mandrel pattern and to thereby form a new feature pattern comprising a number of features that is triple the number of mandrel lines. The one or more transfer modules are used to transfer the workpiece between the first film-forming module, the first etching module, the second film-forming module, the second etching module, and the third etching module without breaking vacuum.

In one embodiment, the integrated sequence of processing steps includes receiving a workpiece into the common manufacturing platform, the workpiece having a mandrel pattern formed thereon comprising a number of features separated by a first pitch distance, and using the one or more film-forming modules and the one or more etching modules, forming a sidewall spacer pattern based, at least in part, on the mandrel pattern, the sidewall spacer pattern comprising a plurality of second features separated by a second pitch distance with the first pitch distance being greater than the second pitch distance. The integrated sequence of processing steps further includes obtaining measurement data related to the forming of the sidewall spacer pattern, the measurement data being used to determine a thickness, width, or profile of the sidewall spacer pattern, and repairing the sidewall spacer pattern by (i) selectively depositing additional material onto a structure, (ii) conformally depositing additional material onto a structure, (iii) reshaping a structure, (iv) etching a structure, (v) implanting dopant into a structure, (vi) removing and reapplying a material layer of a structure, or any combination of two or more thereof, when the thickness, width, or profile of the sidewall spacer pattern does not meet a target thickness, width, or profile of the sidewall spacer pattern. The integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment.

In a related embodiment, forming the sidewall spacer pattern includes conformally applying a thin film over the mandrel pattern in one of the one or more film-forming modules, removing the thin film from upper surfaces of the mandrel pattern and lower surfaces adjacent the mandrel pattern in one of the one or more etching modules to leave behind the thin film on sidewalls of the mandrel pattern thereby forming sidewall spacers, and removing the mandrel pattern from the workpiece in one of the one or more etching modules to leave behind the sidewall spacers, wherein the sidewall spacers form the sidewall spacer pattern having a multiplicity of the number of features of the removed mandrel pattern.

In another related embodiment, forming the sidewall spacer pattern includes conformally applying a first thin film over the mandrel pattern in one of the one or more film-forming modules, removing the first thin film from upper surfaces of the mandrel pattern and lower surfaces adjacent the mandrel pattern in one of the one or more etching modules to leave behind the first thin film on sidewalls of the mandrel pattern thereby forming first sidewall spacers, conformally applying a second thin film over the first sidewall spacers and mandrel pattern in one of the one or more film-forming modules, removing the second thin film from upper surfaces of the first sidewall spacers and mandrel pattern and lower surfaces adjacent the first sidewall spacers in one of the one or more etching modules to leave behind the second thin film on sidewalls of the first sidewall spacers thereby forming second sidewall spacers, and removing the first sidewall spacers from the workpiece in one of the one or more etching modules to leave behind the second sidewall spacers and mandrel pattern to form a feature pattern having a multiplicity of the number of features of the removed mandrel pattern.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1A:
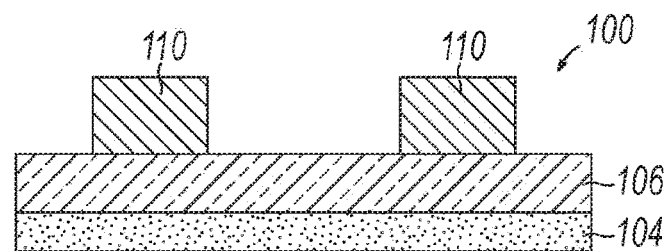
FIGS. 1A-1E are schematic cross-sectional diagrams illustrating one embodiment of a self-aligned double patterning method.

Methods using an integrated platform for self-aligned multi-patterning (SAMP) are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that it is present in every embodiment. Thus, the phrases such as "in one embodiment" or "in an embodiment" that may appear in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein the term "workpiece" means a composition of materials or layers formed on a substrate during one or more phases of a semiconductor device manufacturing process, the workpiece ultimately comprising the semiconductor device at a final stage of processing.

The present embodiments include methods for SAMP that utilize a common manufacturing platform in which multiple processing steps are performed on the common platform within a controlled environment, for example, without breaking vacuum between operations. The integrated end-to-end platform includes both etching modules and film-forming modules and is configured to transfer a workpiece from one module to another while maintaining the workpiece in a controlled environment, e.g., without breaking vacuum or leaving an inert gas protective environment outside of the common manufacturing platform, and thus avoiding exposure to an ambient environment. Any SAMP process may be carried out on the common manufacturing platform, and the integrated end-to-end platform will enable high-volume manufacturing at reduced cost with improvement to yield, defectivity levels and EPE. As used herein, SAMP processes include any spacer patterning technique or sidewall image transfer technique for reducing the pitch of features on the workpiece, which may also be referred to as increasing the pitch density. SAMP processes include, by way of example and not limitation, self-aligned double, triple, quadruple, octuple, etc. patterning, multicolor alternating materials, self-blocking and cutting, multicolor patterned mask layers, etc. "Pitch" or "pitch distance" as used herein is the distance between two identical points in two adjacent features of the pattern. A pattern having an initial number of features separated by a first pitch distance may be multiplied to increase the number of features and thereby decrease the pitch distance, or pitch. For example, in a quadruple patterning process, the number of features, i.e., the pitch density, is quadrupled and the pitch or pitch distance is reduced by a factor of 4, i.e., ¼ the initial pitch. While this may be erroneously referred to as pitch multiplication, it is more accurately termed pitch reduction or pitch density multiplication As used herein, a "film-forming module" refers to any type of processing tool for depositing or growing a film or layer on a workpiece in a process chamber. The film-forming module may be a single wafer tool, a batch processing tool, or a semi-batch processing tool. The types of film deposition or growth that may be performed in the film-forming module include, by way of example and not limitation, chemical vapor deposition, plasma-enhanced or plasma-assisted chemical vapor deposition, atomic layer deposition, physical vapor deposition, thermal oxidation or nitridation, etc., and the process may be isotropic, anisotropic, conformal, selective, blanket, etc.

As used herein, an "etching module" refers to any type of processing tool for removing all or a portion of a film, layer, residue or contaminant on a workpiece in a process chamber. The etching module may be a single wafer tool, a batch processing tool, or a semi-batch processing tool. The types of etching that may be performed in the etching module include, by way of example and not limitation, chemical oxide removal (COR), dry (plasma) etching, reactive ion etching, wet etching using immersion or non-immersion techniques, atomic layer etching, chemical-mechanical polishing, cleaning, ashing, lithography, etc., and the process may be isotropic, anisotropic, selective, etc.

As used herein, "module" generally refers to a processing tool with all of its hardware and software collectively, including the process chamber, substrate holder and movement mechanisms, gas supply and distribution systems, pumping systems, electrical systems and controllers, etc. Such details of the modules are known in the art and therefore not discussed herein.

In its broadest terms, embodiments of the disclosure relate to an integrated sequence of processing steps performed on a workpiece and executed on a common manufacturing platform hosting a plurality of processing modules including one or more film-forming modules, one or more etching modules, and one or more transfer modules. The integrated sequence of processing steps includes receiving a workpiece into the common manufacturing platform, the workpiece having a mandrel pattern formed thereon comprising a number of features, which may be referred to as mandrels or mandrel lines. The features are separated by an initial pitch distance. Using the one or more film-forming modules and the one or more etching modules, a sidewall spacer pattern is formed based, at least in part, on the mandrel pattern. The sidewall spacer pattern has a multiplicity of the number of features of the mandrel pattern, i.e., the pitch density is multiplied. For example, the sidewall spacer pattern may have 2 times, 3 times, 4 times, 6 times, 8 times, etc. the number of features or pitch density. The features of the sidewall spacer pattern are separated by a second pitch distance with the first pitch distance being greater than the second pitch distance, i.e., the pitch is reduced. For example, the second pitch distance may be a half, a third, a fourth, a sixth, an eighth, etc. of the first pitch distance. The integrated sequence of processing steps is executed in a controlled environment within the common manufacturing platform and without leaving the controlled environment, and the one or more transfer modules are used to transfer the workpiece between the plurality of processing modules while maintaining the workpiece within the controlled environment. In the broadest implementation, the controlled environment includes any conditions the substrate 104 is exposed to without being exposed to ambient air or conditions (e.g., temperature, humidity) which are not controlled or monitored by the common manufacturing platform. Exposing the substrate 104 to ambient air, or other uncontrolled conditions, may be referred to as breaking vacuum. In a narrower implementation, the controlled environment may be limited to exposing the substrate 104 to inert gases (e.g., N2, Ar), or any gas which minimizes changes to the exposed substrate 104 surface, under sub-atmospheric conditions. For example, in some instances, the integrated process sequences performed on the common manufacturing platform may be conducted entirely at sub-atmospheric pressure, including treatment steps, metrology steps, and transfer steps. However, in other embodiments, the integrated process sequence can include atmospheric process pressures, or higher pressures, to complete the entire integrated process within the common manufacturing platform. In this implementation, the controlled environment may include a broader range of pressure (e.g., sub-atmospheric, atmospheric or higher) within inert gas environments to limit or control changes to the substrate 104. In this way, if the integrated sequence includes atmospheric, or higher, and sub-atmospheric process conditions, the transition between different pressures occurs within a controlled environment.

Reference is now made to the drawings, where like reference numerals designate identical or corresponding parts throughout the several views.

FIGS. 1A-1D illustrate one embodiment of a self-aligned double patterning (SADP) method for a workpiece and FIGS. 2A-2D continue from the method of FIGS. 1A-1D to illustrate one embodiment of a self-aligned quadruple patterning (SAQP) method. FIG. 3 is a flow chart of a process flow 300 corresponding to the methods of FIGS. 1A-1D and 2A-2D. FIG. 4 illustrates an embodiment of a common manufacturing platform of the invention that may be used for performing process flow 300. The process flow 300 of FIG. 3 and the common manufacturing platform 400 of FIG. 4 will be referenced throughout the following sequential discussion of FIGS. 1A-1E and 2A-2D in which a workpiece 100 is described as it proceeds through an integrated sequence of processing steps.

In operation 302 of process flow 300 and as shown in FIG. 1A, workpiece 100 having a first mandrel pattern 110 formed thereon is provided into the common manufacturing platform 400. The workpiece 100 may include a stack of various materials that have been subjected to a lithographic process in which a resist is coated onto a substrate and exposed to make the first mandrel pattern 110. The resist pattern is then transferred to the underlying layers through a succession of plasma steps. To those familiar in the current art, different schemes are known for creating a mandrel pattern on a substrate, which mandrels may be organic mandrels or hard mandrels, including such materials as silicon, amorphous carbon, photoresist polymer, oxide, nitride, or the like. One such scheme involves deposition of an optical or organic planarizing layer (OPL), typically a spin-on material, then deposition of a silicon anti-reflective coating (SiARC), also spin-on, followed by resist coating and lithographic processes. Another scheme involves deposition of an amorphous carbon layer using CVD deposition, then SiON film deposition using a CVD process, then bottom anti-reflective coating (BARC) deposition using a spin-on process, followed by a resist coating and lithographic processes. For simplicity, workpiece 100 is depicted with a substrate 104 having an underlying layer 106 thereon into which a final pattern is to be transferred, and the first mandrel pattern 110 is formed on the underlying layer 106, although it may be understood that the structure on which the first mandrel pattern 110 is formed may be a multi-layer structure of which the underlying layer 106 is just one of multiple layers. In one embodiment, the multi-layer structure may include a hard mask layer (not show) that is patterned and etched to form a mandrel pattern above the underlying layer 106. The hard mask layer is an alternative to the photoresist masking layer used for transferring the first mandrel pattern 110 to the underlying layer 106. In certain instances, the multi-layer structure (underlying layer 106) may require a more aggressive etch process or multistep etching processes, which the photoresist layer may not be able to withstand, to achieve the desired profile or dimensions for the first mandrel pattern 110. In another embodiment (not shown), the first mandrel pattern 110 may be formed via an etching process performed on the common manufacturing platform 400 subsequent to the operation 302 using any of the patterning techniques disclosed herein.

As shown in FIG. 4, a transfer module 410a may be used to bring the workpiece into the controlled environment of the common manufacturing platform 400, which controlled environment is maintained throughout the process flow 300. The controlled environment may include a vacuum environment, where each operation in the process flow 300 is conducted without breaking vacuum, or an inert gas atmosphere being less than atmospheric pressure, or a combination thereof. A single transfer module may be coupled between each processing module or tool, or separate transfer modules 410a-h may be used for each tool transfer, as depicted in FIG. 4. Transfer modules 410a-h may be collectively referred to herein as transfer modules 410 where appropriate. Where different processing modules on the common manufacturing platform 400 require different controlled environments, such as different vacuum pressures or vacuum in one module followed by a module with inert gas atmosphere, multiple transfer modules 410 may be used where the transfer modules 410 assist in implementing the transitions between the different controlled environments. While a single transfer module may be useful in a cluster-type tool where same-type processing modules are positioned in a circle around the transfer module, multiple transfer modules 410 may be more appropriate in an end-to-end platform configuration with different processing module types such as that depicted in FIG. 4. However, the embodiments herein do not preclude an end-to-end platform configuration that utilizes a single transfer module that is coupled to each of the processing modules, or some configuration in between, for example, a common transfer module for adjacent same-type processing modules that are used in sequence.

As is well known in high volume manufacturing, a front-end module 402a may be used to load a cassette of workpieces (not shown), sequentially line up the workpieces and insert them into a load lock, then into a transfer module 410a in a controlled environment, and the transfer module 410a sequentially loads the workpieces into a processing module. In the common manufacturing platform 400 of an embodiment of the invention, in operation 302, the workpiece 100, which has been received into the controlled environment, is loaded by the transfer module 410a into a film-forming module 420 hosted on the common manufacturing platform 400.

Figure 1B:
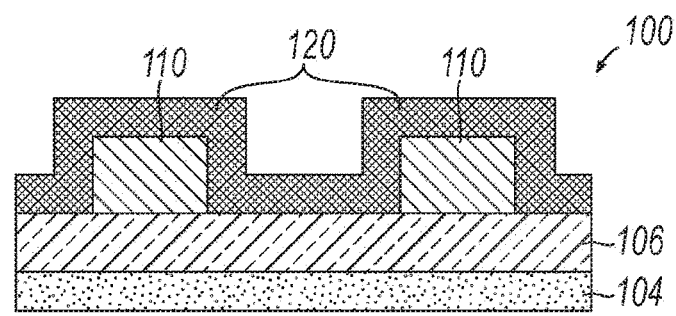

Referring to FIGS. 1B and 3, in operation 304, in the film-forming module 420, a first thin film 120 is conformally deposited over the first mandrel pattern 110 and underlying layer 106. The first thin film 120 can comprise an oxide, a nitride, silicon, or any combination thereof, for example, silicon nitride, silicon oxide, or silicon oxynitride. As shown, the common manufacturing platform 400 may include two identical film-forming modules 420 on opposing sides of the transfer module 410a. By mirroring the two sides of the platform 400, end-to-end processing can be achieved for two workpieces concurrently, and if one film-forming module 420 goes out of service temporarily, the platform 400 can continue to operate, at least at 50% capacity.

Figure 1C:
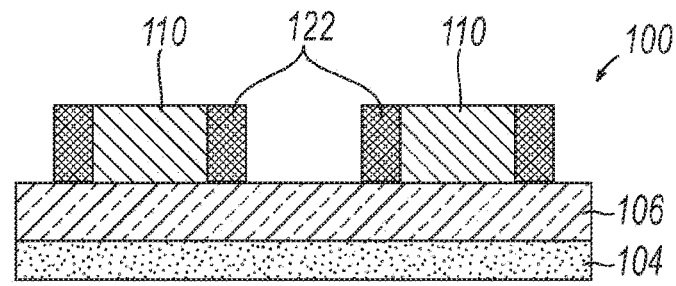

Then, without leaving the controlled environment, e.g., without breaking vacuum, transfer modules 410a and 410b are used to transfer the workpiece 100 to an etching module 430 such as first etching module 430a also hosted on the common manufacturing platform 400, e.g., transfer module 410a removes the workpiece 100 from film-forming module 420 and transfers it to transfer module 410b, which then delivers the workpiece into first etching module 430a. Adjustments to the controlled environment may be made in transfer modules 410a and 410b if first etching module 430a operates with different parameters than film-forming module 420, such as different vacuum pressures. Referring to FIGS. 1C and 3, in operation 306, the first thin film 120 is etched in first etching module 430a to leave behind the first thin film 120 on sidewalls of the first mandrel pattern 110, which remaining thin film 120 forms first sidewall spacers 122. For example, operation 306 may be a first spacer reactive ion etch (RIE) process that creates the first sidewall spacers 122 by removing the first thin film 120 from upper surfaces of the first mandrel pattern 110 and from lower surfaces adjacent to the first mandrel pattern 110, e.g., from the underlying layer 106. Again, the common manufacturing platform 400 may include two identical first etching modules 430a on opposing sides of the transfer module 410b.

Figure 1D:
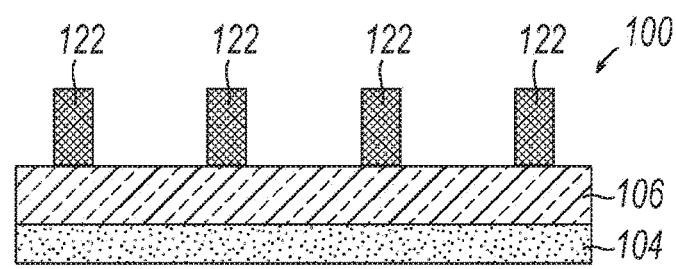

Thereafter, and again without leaving the controlled environment, e.g., without breaking vacuum, in operation 308, with reference to FIGS. 1D and 3, a first mandrel pull process is performed, the first mandrel pull process removing the first mandrel pattern 110 leaving behind the remaining thin film 120 that formed the first sidewall spacers 122. The first mandrel pull process may be performed in the same etching module 430 used in operation 306 or in another etching module 430 such as second etching module 430b hosted on the common manufacturing platform 400. In the event a second etching module 430b is used, a transfer module 410 is used to transfer the workpiece from the first etching module 430a to the second etching module 430b without leaving the controlled environment. As shown, two transfer modules 410b, 410c may be used to make the transfer, the transfer module 410b removing the workpiece from the first etching module 430a, and transferring it to the transfer module 410c, which then delivers the workpiece into second etching module 430b. Adjustments to the controlled environment may be made in transfer modules 410b and 410c if second etching module 430b operates with different parameters than first etching module 430a, such as different vacuum pressures. Again, the common manufacturing platform 400 may include two identical second etching modules 430b on opposing sides of the transfer module 410c. With the first mandrel pattern 110 removed, the first sidewall spacers 122 that remain form a new feature pattern with double the number of features compared to the number of features or mandrels in the first mandrel pattern 110, and with half the pitch of the first mandrel pattern 110.

Optionally, the workpiece may be subjected to one or more cleaning processes before further patterning operations. For example, cleaning may be performed in the same etching module 430 used in operation 308 or in another etching module 430 such as third etching module 430c hosted on the common manufacturing platform 400. In the event a third etching module 430c is used, a transfer module 410 is used to transfer the workpiece from the second etching module 430b to the third etching module 430c without leaving the controlled environment, e.g., without breaking vacuum. As shown, two transfer modules 410c, 410d may be used to make the transfer, the transfer module 410c removing the workpiece from the second etching module 430b, and transferring it to the transfer module 410d, which then delivers the workpiece into the third etching module 430c. Adjustments to the controlled environment may be made in transfer modules 410c and 410d if the third etching module 430c operates with different parameters than the second etching module 430b, such as different vacuum pressures. Again, the common manufacturing platform 400 may include two identical third etching modules 430c on opposing sides of the transfer module 410d. In one embodiment, as illustrated in FIG. 4, third etching module 430c is a COR tool for performing a chemical oxide removal.

Figure 1E:
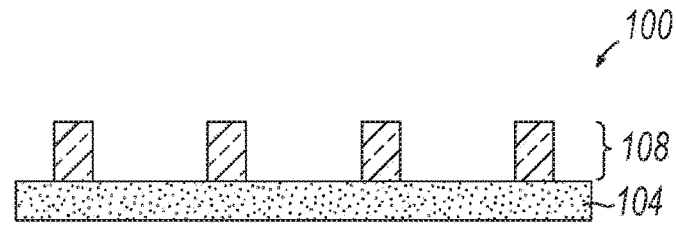

The first sidewall spacers 122, which form the new feature pattern, may be used in an operation 318 as shown by arrow 310 in FIG. 3 to transfer the new feature pattern into the underlying layer 106, to form the doubled pattern 108 in FIG. 1E. The doubled pattern 108 in FIG. 1E may be used as a second mandrel pattern 222 for quadrupling the first mandrel pattern 110, as described in operations 312-318 below with references to FIGS. 2A-2D and 3. Alternatively, the first sidewall spacers 122 that form the new feature pattern in FIG. 1D may be used as a second mandrel pattern 222 for quadrupling the first mandrel pattern 110, as described in operations 312-318 below with reference to FIGS. 2A-2D and 3.

Figure 2A:
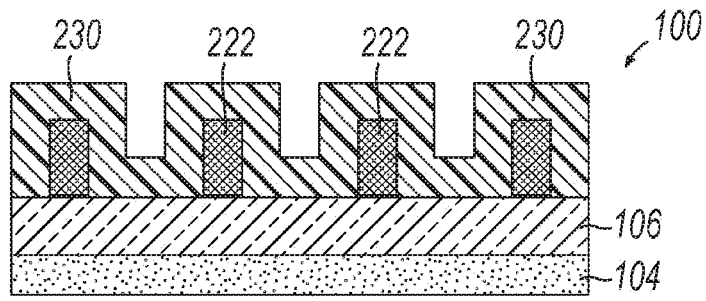
FIGS. 2A-2D are schematic cross-sectional diagrams illustrating one embodiment of a self-aligned quadruple patterning method.
Figure 3:
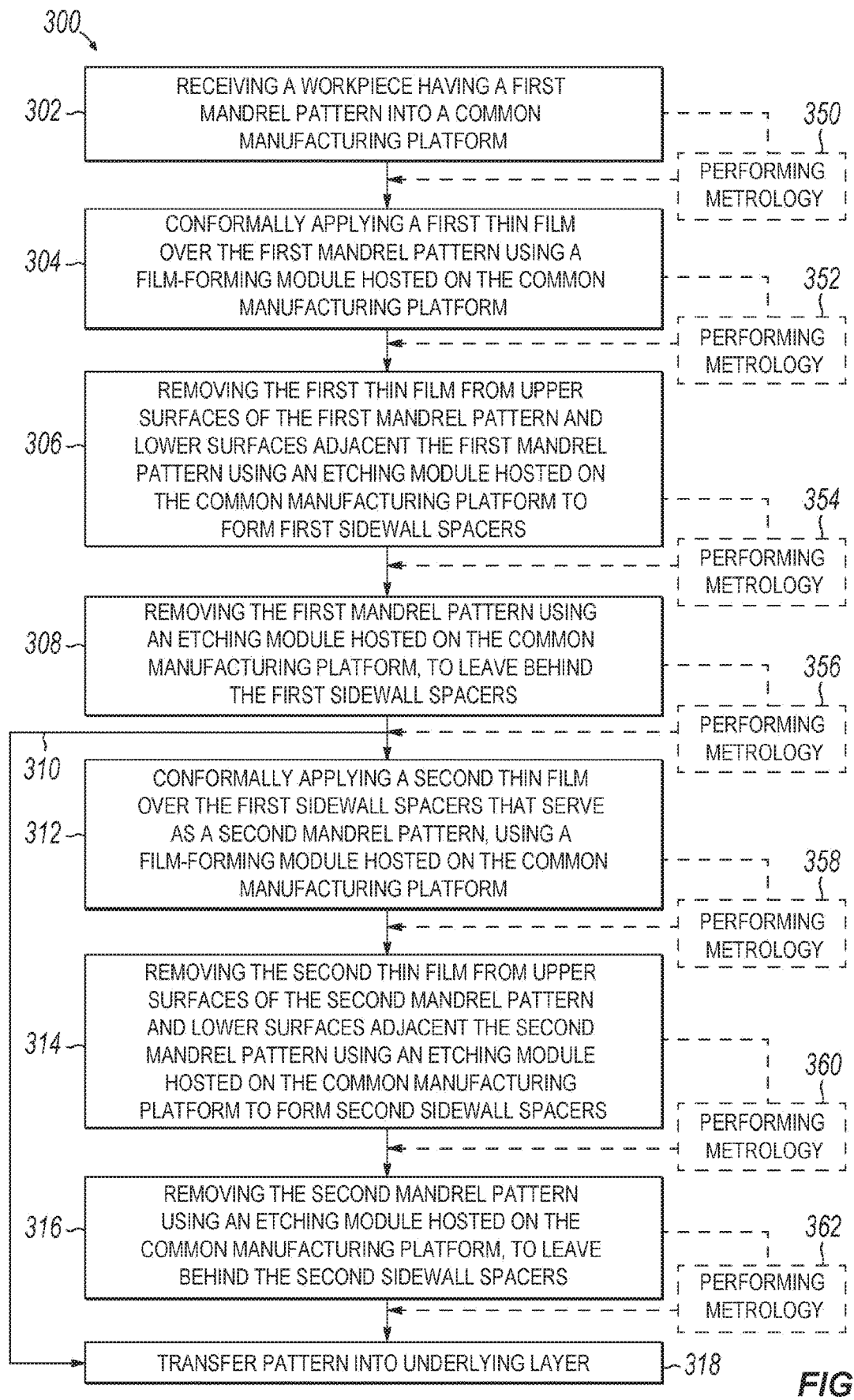
FIG. 3 is a flow chart diagram illustrating one embodiment of an integrated process flow for self-aligned multi-patterning.
Figure 4:
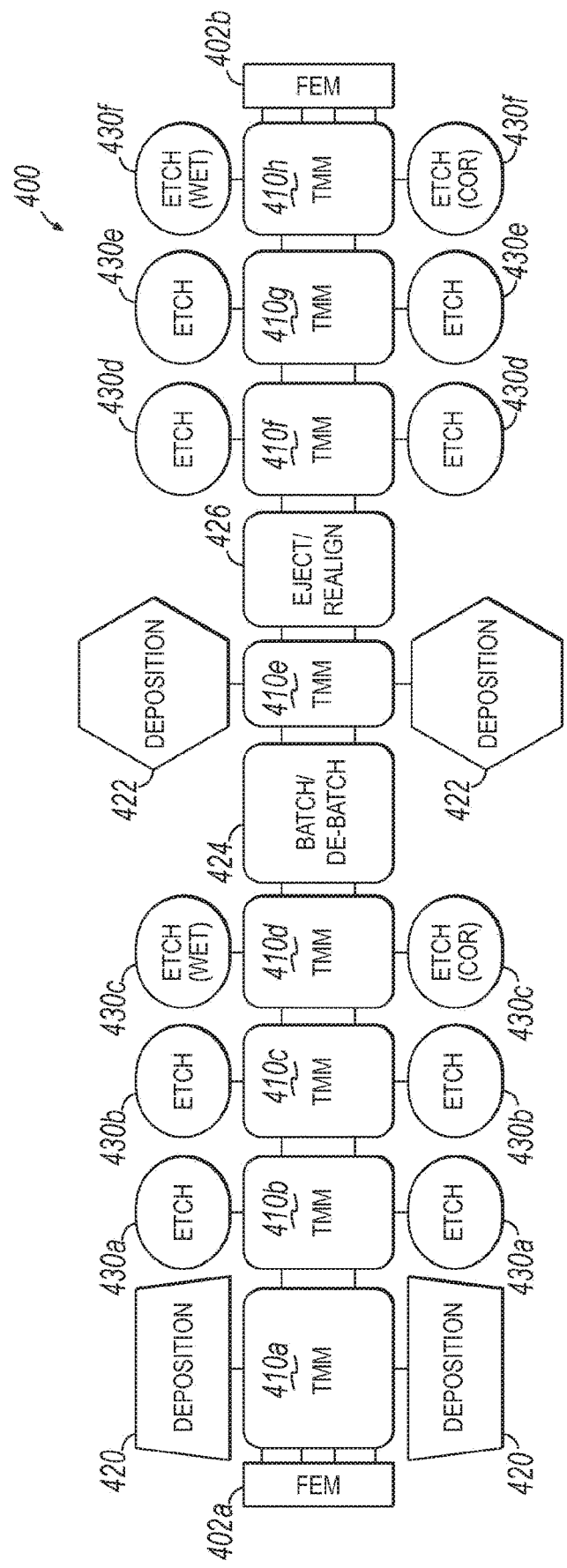
FIG. 4 is a schematic diagram illustrating one embodiment of a common manufacturing platform for performing an integrated self-aligned multi-patterning method.

Referring to FIGS. 2A and 3, in operation 312, and again without leaving the controlled environment, e.g., without breaking vacuum, a second thin film 230 is conformally deposited over the second mandrel pattern 222 and underlying layer 106. The second thin film 230 can comprise an oxide, a nitride, or silicon, for example, titanium oxide. The deposition may be performed in the same film-forming module 420 used in operation 304 or in a different film-forming module 422 hosted on the common manufacturing platform 400. A transfer module 410 is used to transfer the workpiece 100 from the third etching module 430c (or from the second etching module 430b if there is no third etching module 430c) to the film-forming module 422 without breaking vacuum. As shown, two transfer modules 410d, 410e may be used to make the transfer, the transfer module 410d removing the workpiece 100 from the third etching module 430c, and transferring it to the transfer module 410e, which then delivers the workpiece 100 into film-forming module 422. Additionally, as shown, where there is a change in the number of workpieces 100 to be processed by a module, a batch/de-batch module 424 and an eject/realign module 426 may be inserted in the process flow on the common manufacturing platform 400. In one embodiment, film-forming module 422 is a semi-batch deposition tool, for example a 6-wafer tool, while the etching modules 430a-f are single wafer tools. Transfer module 410 then transfers workpieces 100 sequentially into the batch/de-batch module 424 for batch positioning, and the semi-batch (e.g., 6 workpieces) is then transferred by transfer module 410e into the film-forming module 422. After the semi-batch is processed, transfer module 410e transfers the workpieces 100 into the eject/realign module 426 to realign the workpieces 100 and transfer them sequentially to the next single wafer tool, for example, via transfer module 410f. Adjustments to the controlled environment may be made in transfer modules 410d and 410e as well as batch/de-batch module 424 if film-forming module 422 operates with different parameters than third etching module 430c, such as different vacuum pressures. Again, the common manufacturing platform 400 may include two identical film-forming modules 422 on opposing sides of the transfer module 410e.

Figure 2B:
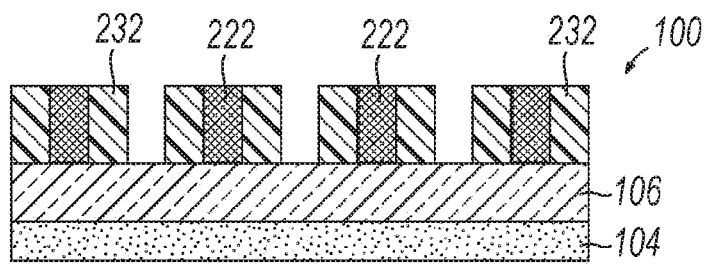

Then, without leaving the controlled environment, e.g., without breaking vacuum, transfer module 410f is used to transfer the workpiece 100 to an etching module 430 also hosted on the common manufacturing platform 400, which may be the same etching module 430 used in operation 306, or another etching module 430 such as fourth etching module 430d. Adjustments to the controlled environment may be made in transfer modules 410e and 410f as well as eject/realign module 426 if fourth etching module 430d operates with different parameters than film-forming module 422, such as different vacuum pressures. In operation 314, the second thin film 230 is etched to leave behind the second thin film 230 on sidewalls of the second mandrel pattern 222, which remaining second thin film 230 forms second sidewall spacers 232, as shown in FIG. 2B. For example, operation 314 may be a second spacer reactive ion etch (RIE) process that creates the second sidewall spacers 232 by removing the second thin film 230 from upper surfaces of the second mandrel pattern 222 and from lower surfaces adjacent to the second mandrel pattern 222, e.g., from the underlying layer 106.

Figure 2C:
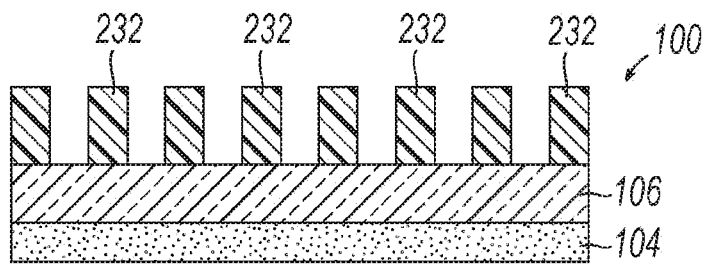

Thereafter, and again without leaving the controlled environment, e.g., without breaking vacuum, in operation 316, a second mandrel pull process is performed, the second mandrel pull process removing the second mandrel pattern 222 leaving behind the remaining thin film 230 that formed the second sidewall spacer pattern 232, as shown in FIG. 2C. The second mandrel pull process may be performed in the same etching module 430 used in operation 308, or in another etching module such as fifth etching module 430e hosted on the common manufacturing platform 400. In the event a fifth etching module 430e is used, a transfer module 410 is used to transfer the workpiece 100 from the fourth etching module 430d to fifth etching module 430e without leaving the controlled environment. As shown, two transfer modules 410f, 410g may be used to make the transfer, the transfer module 410f removing the workpiece from the fourth etching module 430d, and transferring it to the transfer module 410g, which then delivers the workpiece 100 into fifth etching module 430e. Adjustments to the controlled environment may be made in transfer modules 410f and 410g if fifth etching module 430e operates with different parameters than fourth etching module 430d, such as different vacuum pressures. Again, the common manufacturing platform 400 may include two identical fifth etching modules 430e on opposing sides of the transfer module 410g. With the second mandrel pattern 222 removed, the second sidewall spacers 232 that remain form another new feature pattern with quadruple the number of features compared to the number of features or mandrels in the first mandrel pattern 110, and with a quarter of the pitch of the first mandrel pattern 110.

Figure 2D:
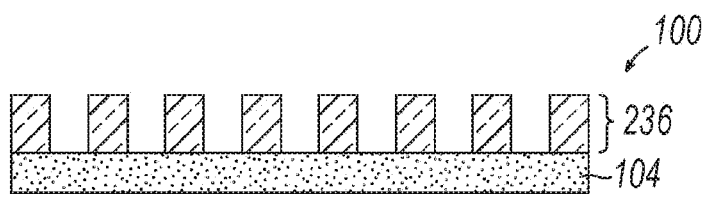

The second sidewall spacers 232 may be used in an operation 318 to transfer the new feature pattern into the underlying layer 106 to form the quadrupled pattern 236, as shown in FIG. 2D. The quadrupled sidewall spacers 232 in FIG. 2C or the quadrupled pattern 236 in FIG. 2D may be used as a third mandrel pattern 222 for octupling the first mandrel pattern 110, as described in operations 312-318 above with references to FIGS. 2A-2D and 3. Operation 318, whether performed after operation 308 or after operation 316, may be performed in an etching module 430 on the common manufacturing platform 400 without leaving the controlled environment, or may be performed after leaving the common manufacturing platform 400. If performed on the common manufacturing platform 400, any etching module 430 may be used, including etching modules 430a-f or a different etching module (not shown). Upon completion of process flow 300, or that portion of process flow 300 that is to be performed in the common manufacturing platform 400, the workpiece 100 exits the common manufacturing platform 400 via another front-end module 402b, which may be identical to front-end module 402a, although located at the back end of the end-to-end arrangement of modules on common manufacturing platform 400. In the generally reverse process of front-end module 402a, the workpieces 100 are sequentially transferred by transfer module 410h to a load lock where the controlled environment is removed and then into a cassette (not shown) on the front-end module 402b. The common manufacturing platform 400 arranged in a substantially mirrored fashion has the advantage of providing redundancy in the event a module has to go out of service, where the common manufacturing platform 400 could still operate at a reduced capacity.

In one embodiment, and as will be discussed in more detail below, the common manufacturing platform 400 advantageously includes an "active interdiction system." The active interdiction system includes a workpiece measurement region within a transfer module 410 hosted on the common manufacturing platform 400 or an integrated metrology module (not shown) hosted on the common manufacturing platform 400. The workpiece measurement region may be located in a dedicated area of the transfer module 410, as described in more detail below. The workpiece measurement region or metrology module may include an inspection system for gathering measurement data. As described in more detail below, the inspection system may include at least one optical source for directing an optical beam incident on a measurement surface of the workpiece and at least one detector arranged to receive an optical signal scattered from the measurement surface of the workpiece. The active interdiction system may further include an intelligence system hosted on the common manufacturing platform 400 that is configured to gather data from the workpiece measurement region or metrology module and control the integrated sequence of processing steps executed on the common manufacturing platform 400, such as process flow 300.

For active interdiction in accordance with embodiments of the invention, the workpiece measurement region or metrology module collects real time data "on the fly" pertaining to attributes of features or layers on the semiconductor workpiece (e.g., film or feature thickness, feature depth, surface roughness, pattern shift, voids or other defects, loss of selectivity, lateral overgrowth, uniformity, etc.) and uses such real time data to concurrently control integration operating variables in the integrated processing modules hosted on the common manufacturing platform 400. The data can be used in a feed-back and/or feed-forward manner to control operations performed on the workpiece in subsequent modules and/or to control operations performed in prior modules on a subsequent workpiece, for example as will be explained below with reference to operations 350-362 of FIG. 3. In an embodiment, the common manufacturing platform 400 includes a correction module, which may be a film-forming module 420 or 422, an etching module 430, or other type of treatment module as appropriate for applying corrective action or remedial treatment to the workpiece 100.

Unlike traditional metrology or process control, the workpiece does not leave the controlled environment to enter a stand-alone metrology tool thereby minimizing oxidation and defect generation, the measurements are non-destructive such that no workpiece is sacrificed to obtain data thereby maximizing production output, and the data can be collected in real time as part of the process flow to avoid negatively impacting production time and to enable in-process adjustments to the workpiece or to subsequent workpieces being sequentially processed on the common manufacturing platform 400. Additionally, the measurements are not performed in the film-forming or etching modules, thereby avoiding issues when measurement devices are exposed to process fluids. For example, by incorporating workpiece measurement regions into the transfer module, the data can be obtained as the workpiece is traveling between processing tools with little to no delay in the process flow, without exposure to process fluids, and without leaving the controlled environment, e.g., without breaking vacuum. While the "on the fly" data may not be as accurate as the data obtained from traditional destructive methods performed in stand-alone metrology tools, the nearly instantaneous feedback on the process flow and ability to make real-time adjustment without interrupting the process flow or sacrificing yield is highly beneficial for high-volume manufacturing.

With further reference to the process flow 300 of FIG. 3, the method may include inspecting the workpiece, such as performing metrology, i.e., obtaining measurement data, using the active interdiction system at any of various times throughout the integrated method, without leaving the controlled environment, e.g., without breaking vacuum. Inspection of the workpiece may include characterizing one or more attributes of the workpiece and determining whether the attribute meets a target condition. For example, the inspection may include obtaining measurement data related to an attribute and determining whether a defectivity, a film conformality, a thickness, a uniformity, and/or a selectivity condition meets a target for that condition. While the following discussion will focus on obtaining measurement data, it may be understood that other inspection techniques performed within the controlled environment of the common manufacturing platform are also within the scope of the invention.

The active interdiction system may include a single metrology module or workpiece measurement region on the common manufacturing platform 400 or may include multiple metrology modules or workpiece measurement regions on the common manufacturing platform 400, as will be discussed in more detail below. Each metrology operation is optional, as indicated by the phantom lines in FIG. 3, but may be advantageously performed at one or more points in the process flow to ensure the workpiece 100 is within specification to reduce defectivity and EPE. In one embodiment, measurement data is obtained after each step of the integrated sequence of processing steps conducted on the common manufacturing platform. The measurement data may be used to repair the workpiece in a correction module prior to leaving the common manufacturing platform, and/or may be used to alter parameters of the integrated sequence of processing steps for subsequent workpieces.

In broad terms, within the controlled environment, measurement data may be obtained during the integrated sequence of processing steps related to the formation of the sidewall spacer pattern and, based on the measurement data, a determination may be made whether a thickness, width, or profile of the sidewall spacer pattern meets a target condition. When the thickness, width, or profile of the sidewall spacer pattern is determined to not meet the target condition, the workpiece may be processed in a correction module on the common manufacturing platform to alter the sidewall spacer pattern. In one embodiment, when the target thickness, width, or profile of the sidewall spacer pattern is not met, the sidewall spacer pattern may be repaired by (i) selectively depositing additional material onto a structure, (ii) conformally depositing additional material onto a structure, (iii) reshaping a structure, (iv) etching a structure, (v) implanting dopant into a structure, (vi) removing and reapplying a material layer of a structure, or any combination of two or more thereof.

In an embodiment, when a conformality or uniformity of a thin film applied in a film-forming module on the common manufacturing platform does not meet a target conformality or target uniformity for the thin film, corrective action may be taken to repair the thin film. Repairing a conformally applied thin film may be accomplished by removing the thin film and reapplying the thin film, conformally applying an additional thin film, etching the thin film, or a combination of two or more thereof. For example, the workpiece may be transferred to a correction etching module to remove the thin film or partially etch the thin film, and/or the workpiece may be transferred to a correction film-forming module to reapply the thin film after it is removed or to apply additional thin film over the existing thin film or partially etched thin film.

In an embodiment, when the thickness, width, or profile of the sidewall spacers formed in an etching module on the common manufacturing platform does not meet a target thickness, width, or profile of the sidewall spacers, corrective action may be taken to repair the sidewall spacers. Repairing sidewall spacers may be accomplished by selectively depositing additional material onto the sidewall spacers, reshaping the sidewall spacers, implanting dopant into the sidewall spacers, or a combination of two or more thereof. For example, the workpiece may be transferred to a correction film-forming module to selectively deposit spacer material or to one or more correction film-forming and/or etching modules to perform a sidewall spacer reshaping process.

The correction modules may be different film-forming and etching modules that are designated as correction modules on the common manufacturing platform or another type of treatment module integrated on the common manufacturing platform, such as a thermal annealing module, or may be the same film-forming and etching modules used to conformally apply the thin film, etch the thin film, and remove the mandrel pattern.

The process flow 300 of FIG. 3 will now be described in detail with the optional metrology operations. Operation 302 includes receiving a workpiece having a first mandrel pattern into a common manufacturing platform. Operation 350 includes optionally performing metrology to obtain measurement data related to attributes of the incoming workpiece, such as attributes of the first mandrel pattern and/or an underlying layer over which the mandrel pattern is formed and into which the final pattern is to be transferred, which measurement data may be used to adjust and/or control process parameters of any one of operations 304-318.

Operation 304 includes conformally applying a first thin film over the first mandrel pattern using a film-forming module hosted on the common manufacturing platform. Operation 352 includes optionally performing metrology to obtain measurement data related to attributes of the workpiece having the conformal first thin film applied, such as attributes of the first thin film, the first mandrel pattern as affected by the thin film deposition, and/or the underlying layer into which the final pattern is to be transferred as affected by the thin film deposition, which measurement data may be used to adjust and/or control process parameters of any one of operations 306-318, may be used to make adjustments for subsequent workpieces to the incoming attributes of the workpieces in operation 302 or to operation 304, or may be used to repair the workpiece before continued processing. In one embodiment, when the measurement data indicates that one or more attributes do not meet a target condition, the workpiece may be transferred to a correction module to repair the conformally applied first thin film. For example, when a conformality or uniformity of the first thin film does not meet a target conformality or target uniformity for the first thin film, corrective action may be taken in one or more correction modules, such as removing the thin film and reapplying the thin film, conformally applying an additional thin film, etching the thin film, or a combination of two or more thereof.

Operation 306 includes removing the first thin film from upper surfaces of the first mandrel pattern and lower surfaces adjacent the first mandrel pattern (e.g., from the underlying layer) using an etching module hosted on the common manufacturing platform to form first sidewall spacers (referred to as a spacer etch). Operation 354 includes optionally performing metrology to obtain measurement data related to attributes of the workpiece having the etched first thin film forming first sidewall spacers on the sidewalls of the first mandrel pattern, such as attributes of the first sidewall spacers, the first mandrel pattern as affected by the spacer etch, and/or the underlying layer as affected by the spacer etch, which measurement data may be used to adjust and/or control process parameters of any one of operations 308-318, may be used to make adjustments for subsequent workpieces to the incoming attributes of the workpieces in operation 302 or to operations 304-306, or may be used to repair the workpiece before continued processing. In one embodiment, when the measurement data indicates that one or more attributes do not meet a target condition, the workpiece may be transferred to a correction module to repair the first sidewall spacers on the sidewalls of the mandrel pattern. For example, when the thickness, width, or profile of the sidewall spacers does not meet a target thickness, width, or profile of the sidewall spacers, corrective action may be taken in one or more correction modules, such as by selectively depositing additional material onto the sidewall spacers, reshaping the sidewall spacers, implanting dopant into the sidewall spacers, or a combination of two or more thereof.

Operation 308 includes removing the first mandrel pattern (referred to as a mandrel pull) using an etching module hosted on the common manufacturing platform to leave behind the first sidewall spacers. Operation 356 includes optionally performing metrology to obtain measurement data related to attributes of the workpiece having the first sidewall spacers, such as attributes of the first sidewall spacers as affected by the mandrel pull and/or the underlying layer as affected by the mandrel pull, which measurement data may be used to adjust and/or control process parameters of any one of operations 310-318, may be used to make adjustments for subsequent workpieces to the incoming attributes of the workpieces in operation 302 or to operations 304-308, or may be used to repair the workpiece before continued processing. In one embodiment, when the measurement data indicates that one or more attributes do not meet a target condition, the workpiece may be transferred to a correction module to repair the first sidewall spacers. For example, when the thickness, width, or profile of the sidewall spacers does not meet a target thickness, width, or profile of the sidewall spacers, corrective action may be taken in one or more correction modules, such as by selectively depositing additional material onto the sidewall spacers, reshaping the sidewall spacers, implanting dopant into the sidewall spacers, or a combination of two or more thereof.

In a SADP embodiment, process flow 300 may proceed to operation 318, discussed below, via SADP flow 310, either without or after operation 356.

Operation 312 includes conformally applying a second thin film over the first sidewall spacers that serve as a second mandrel pattern, using a film-forming module hosted on the common manufacturing platform. Operation 358 includes optionally performing metrology to obtain measurement data related to attributes of the workpiece having the conformal second thin film applied, such as attributes of the second thin film, the second mandrel pattern as affected by the thin film deposition, and/or the underlying layer as affected by the thin film deposition, which measurement data may be used to adjust and/or control process parameters of any one of operations 314-318, may be used to make adjustments for subsequent workpieces to the incoming attributes of the workpieces in operation 302 or to operations 304-308, or may be used to repair the workpiece before continued processing. In one embodiment, when the measurement data indicates that one or more attributes do not meet a target condition, the workpiece may be transferred to a correction module to repair the conformally applied second thin film. For example, when a conformality or uniformity of the second thin film does not meet a target conformality or target uniformity for the second thin film, corrective action may be taken in one or more correction modules, such as removing the thin film and reapplying the thin film, conformally applying an additional thin film, etching the thin film, or a combination of two or more thereof.

Operation 314 includes removing the second thin film from upper surfaces of the second mandrel pattern and lower surfaces adjacent the second mandrel pattern (e.g., from the underlying layer) using an etching module hosted on the common manufacturing platform to form second sidewall spacers (referred to as a spacer etch). Operation 360 includes optionally performing metrology to obtain measurement data related to attributes of the workpiece having the etched second thin film forming second sidewall spacers on the sidewalls of the second mandrel pattern, such as attributes of the second sidewall spacers, the second mandrel pattern as affected by the spacer etch, and/or the underlying layer as affected by the spacer etch, which measurement data may be used to adjust and/or control process parameters of any one of operations 316-318, may be used to make adjustments for subsequent workpieces to the incoming attributes of the workpieces in operation 302 or to operations 304-314, or may be used to repair the workpiece before continued processing. In one embodiment, when the measurement data indicates that one or more attributes do not meet a target condition, the workpiece may be transferred to a correction module to repair the second sidewall spacers on the sidewalls of the second mandrel pattern. For example, when the thickness, width, or profile of the sidewall spacers does not meet a target thickness, width, or profile of the sidewall spacers, corrective action may be taken in one or more correction modules, such as by selectively depositing additional material onto the sidewall spacers, reshaping the sidewall spacers, implanting dopant into the sidewall spacers, or a combination of two or more thereof.

Operation 316 includes removing the second mandrel pattern (referred to as a mandrel pull) using an etching module hosted on the common manufacturing platform, to leave behind the second sidewall spacers. Operation 362 includes optionally performing metrology to obtain measurement data related to attributes of the workpiece having the second sidewall spacers, such as attributes of the second sidewall spacers as affected by the mandrel pull and/or the underlying layer as affected by the mandrel pull, which measurement data may be used to adjust and/or control process parameters of operation 318, may be used to make adjustments for subsequent workpieces to the incoming attributes of the workpieces in operation 302 or to operations 304-316, or may be used to repair the workpiece before continued processing. In one embodiment, when the measurement data indicates that one or more attributes do not meet a target condition, the workpiece may be transferred to a correction module to repair the second sidewall spacers. For example, when the thickness, width, or profile of the sidewall spacers does not meet a target thickness, width, or profile of the sidewall spacers, corrective action may be taken in one or more correction modules, such as by selectively depositing additional material onto the sidewall spacers, reshaping the sidewall spacers, implanting dopant into the sidewall spacers, or a combination of two or more thereof.

Process parameters, as referred to above, may include any operating variable within a processing module, such as but not limited to: gas flow rates; compositions of etchants, deposition reactants, purge gases, etc.; chamber pressure; temperature; electrode spacing; power; etc. The intelligence system of the active interdiction system is configured to gather measurement data from the inspection system and control the integrated sequence of processing steps executed on the common manufacturing platform, for example, by making in situ adjustments to processing parameters in subsequent processing modules for the workpiece in process, or by changing process parameters in one or more processing modules for subsequent workpieces. Thus, the obtained measurement data may be used to identify a needed repair to the workpiece during the integrated sequence of processing steps to avoid having to scrap the workpiece, and/or to adjust processing parameters for the integrated sequence of processing steps for steps performed on the same workpiece after the measurement data is obtained or for processing subsequent workpieces to reduce occurrences of the target conditions not being met for the subsequent workpieces.

Figure 5:
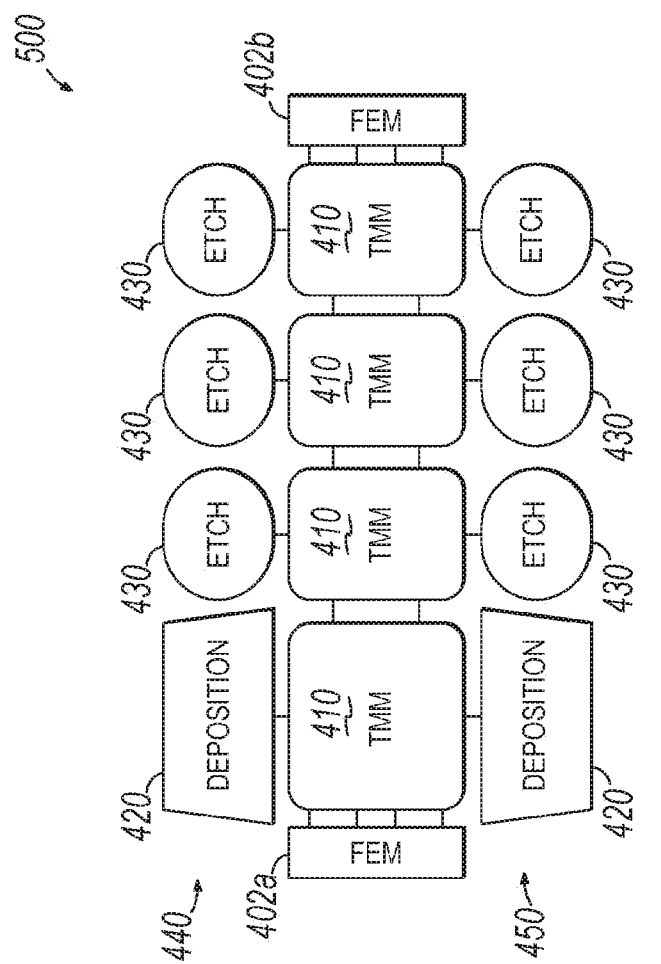
FIG. 5 is a schematic diagram illustrating one embodiment of a common manufacturing platform for performing an integrated self-aligned multi-patterning method.

Referring now to FIG. 5, another embodiment of a common manufacturing platform 500 is provided for executing a SAMP process, such as those described above in FIGS. 1A-1E, 2A-2D and 3, where like reference numerals are used to refer to like parts. Similar to FIG. 4 described above, common manufacturing platform 500 includes front-end modules 402a and 402b at each end of the common manufacturing platform 500 for transferring workpieces 100 into and out of the common manufacturing platform 500. Common manufacturing platform 500 includes a plurality of transfer modules 410 for transferring workpieces into and out of a plurality of processing modules hosted on the common manufacturing platform 500. The plurality of processing modules includes one or more film-forming modules 420, such as one or more deposition tools, and one or more etching modules 430, such as one or more dry etching tools, wet etching tools and/or COR tools. As shown, two film-forming modules 420 may be included, each coupled to one of the transfer modules 410, and which may be the same or different type of tool. As further shown, multiple etching modules 430 may be included, with two etching modules 430 coupled to each of several transfer modules 410. Six etching modules 430 are shown, although a fewer or greater number of etching modules 430 may be included. The film-forming modules 420 may be used to perform operations 304 and 312. The etching modules 430 may be used to perform operations 306, 308, 314, and 316, and optionally operation 318 and other cleaning or etching operations. Any of the processing modules may serve as a correction module for repairing the workpiece, or additional processing modules may be added for performing corrective action. The plurality of processing modules generally forms two lines 440, 450 from front end to back end, one line 440 down one side of a row of transfer modules 410 and the other line 450 down the other side of the row of transfer modules 410.

In one example, a single workpiece 100 is processed down line 440 from front end to back end, then transferred back to the front end and processed again down line 450. Thus, the conformal deposition operation 304, spacer etch operation 306, and mandrel pull operation 308 are performed down line 440 to double the pattern, then the conformal deposition operation 312, spacer etch operation 314, and mandrel pull operation 316 are performed down line 450 to quadruple the pattern, thereby repeating the operations in two passes down the end-to-end common manufacturing platform 500. A wet etch or repair process can be performed at the end of line 440 (in the third etching module 430 shown in sequence or in a film-forming module or other treatment module, not shown) before transferring the workpiece 100 back to the front end in order to clean or repair the second mandrel pattern before repeating the operations in line 450. A COR process or a repair process can be performed at the end of line 450 (in the third etching module 430 shown in sequence or in a film-forming module or other treatment module, not shown) to remove oxide from the quadrupled pattern or repair the pattern before exiting the common manufacturing platform 500. Alternatively, in the third etching module 430 shown in line 450, operation 318 may be performed in a suitable type of etching module. In this example, the additional etching modules at the back-end of the lines 440, 450 may be different from each other, since each of these etching modules 430 will be processing workpieces sequentially at only one stage of the integrated process flow 300.

In another example, the two lines 440, 450 operate independently to process two workpieces 100 concurrently, either temporally in-phase or temporally off-set, each progressing down one of the lines 440 or 450 from front end to back end, then transferred back to the front end and each processed again down the same line 440 or 450. Thus, the conformal deposition operation 304, spacer etch operation 306, and mandrel pull operation 308 are performed down each line 440 and 450 to double the pattern on the two workpieces 100, then the conformal deposition operation 312, spacer etch operation 314, and mandrel pull operation 316 are performed down the lines 440 and 450 to quadruple the pattern on the two workpieces 100, thereby repeating the operations in two passes down the end-to-end common manufacturing platform 500. A cleaning etch or repair process can be performed at the end of the first pass (in the third etching modules 430 shown in sequence or in a film-forming module or other treatment module, not shown) before transferring the workpieces 100 back to the front end in order to clean or repair the second mandrel pattern before repeating the operations. A cleaning etch, repair process, or a pattern transfer etch (operation 318) can be performed at the end of the second pass (in the third etching module 430 shown in sequence or in a film-forming module or other treatment module, not shown) before exiting the common manufacturing platform 500. In this example, the third etching modules 430 (or other type of correction module) would be the same type of module, since they are each processing workpieces at more than one stage of the integrated process flow 300. This example has the advantage of providing redundancy in the event a module has to go out of service, where the common manufacturing platform 500 can still operate at 50% capacity.

In one embodiment, the common manufacturing platform includes at least one deposition module for conformally depositing a thin film over a mandrel pattern, at least one etching module for performing a spacer etch and a mandrel pull, and at least one transfer module for transferring the workpiece between modules while maintaining a controlled environment throughout the integrated process flow. Advantageously, the at least one etching module includes at least two etching modules, one for the spacer etch and one for the mandrel pull. In a further embodiment, the common manufacturing platform includes at least one workpiece measurement region, which is located within a dedicated area of the at least one transfer module or within a metrology module hosted on the common manufacturing platform within the controlled environment, for obtaining measurement data related to one or more attributes of the workpiece. In one embodiment, the common manufacturing platform includes at least one correction module for performing a repair of the workpiece, such as repairing the conformally deposited thin film or the sidewall spacers.

As may be appreciated by persons having ordinary skill in the art, the number and positioning of processing modules on the common manufacturing platform as well as metrology operations may be selected based on the processing time in the different modules needed to carry out the operations in the different modules to provide essentially continuous process flow through the common manufacturing platform and thus good throughput matching.

In one embodiment, the plurality of processing modules on the common manufacturing platform and the integrated process flow are adapted for use in a multi-color SAMP process, where self-aligned blocks (SAB) of different colors (i.e., different materials each having different etch selectivity such that each color represents a different etch rate) are used to enable precise line cuts. In certain embodiments, the integrated process flow for forming a sidewall spacer pattern may include any sequence of process steps as described in embodiments of U.S. Pat. No. 9,818,611 or 10,020,196, each entitled "Methods of Forming Etch Masks for Sub-Resolution Substrate Patterning," which sequence of process steps are executed in the common manufacturing platform without leaving the controlled environment. Further, while double and quadruple patterning are discussed in detail above, the plurality of processing modules on the common manufacturing platform and the integrated process flow may be adapted for use in any multi-patterning process.

Figure 6A:
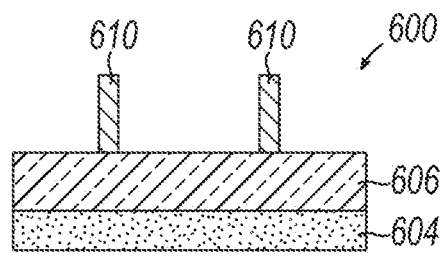
FIGS. 6A-6G are schematic cross-sectional diagrams illustrating one embodiment of a self-aligned triple patterning method.
Figure 6B:
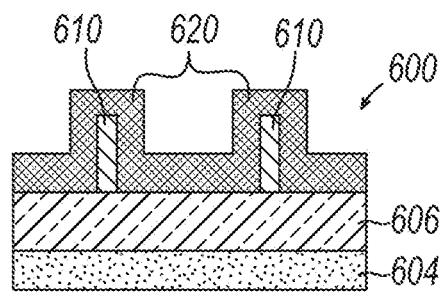
Figure 6C:
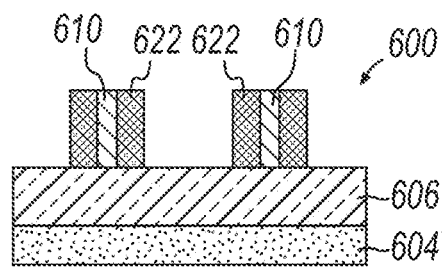
Figure 6D:
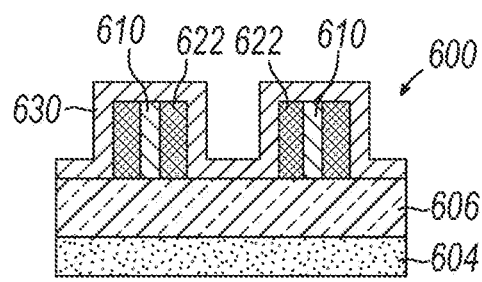
Figure 6E:
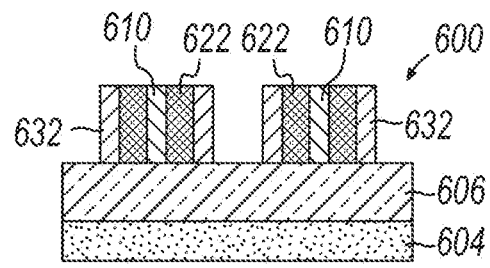
Figure 6F:
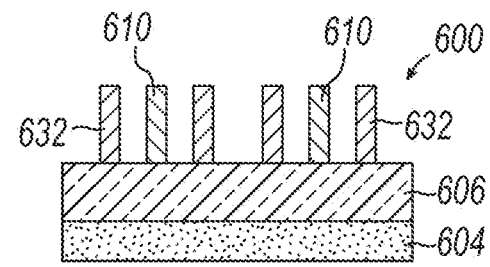
Figure 6G:
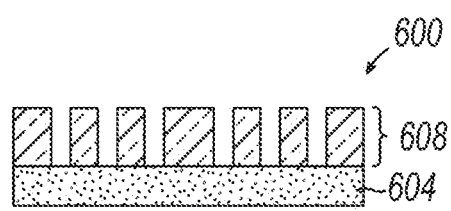
Figure 7:
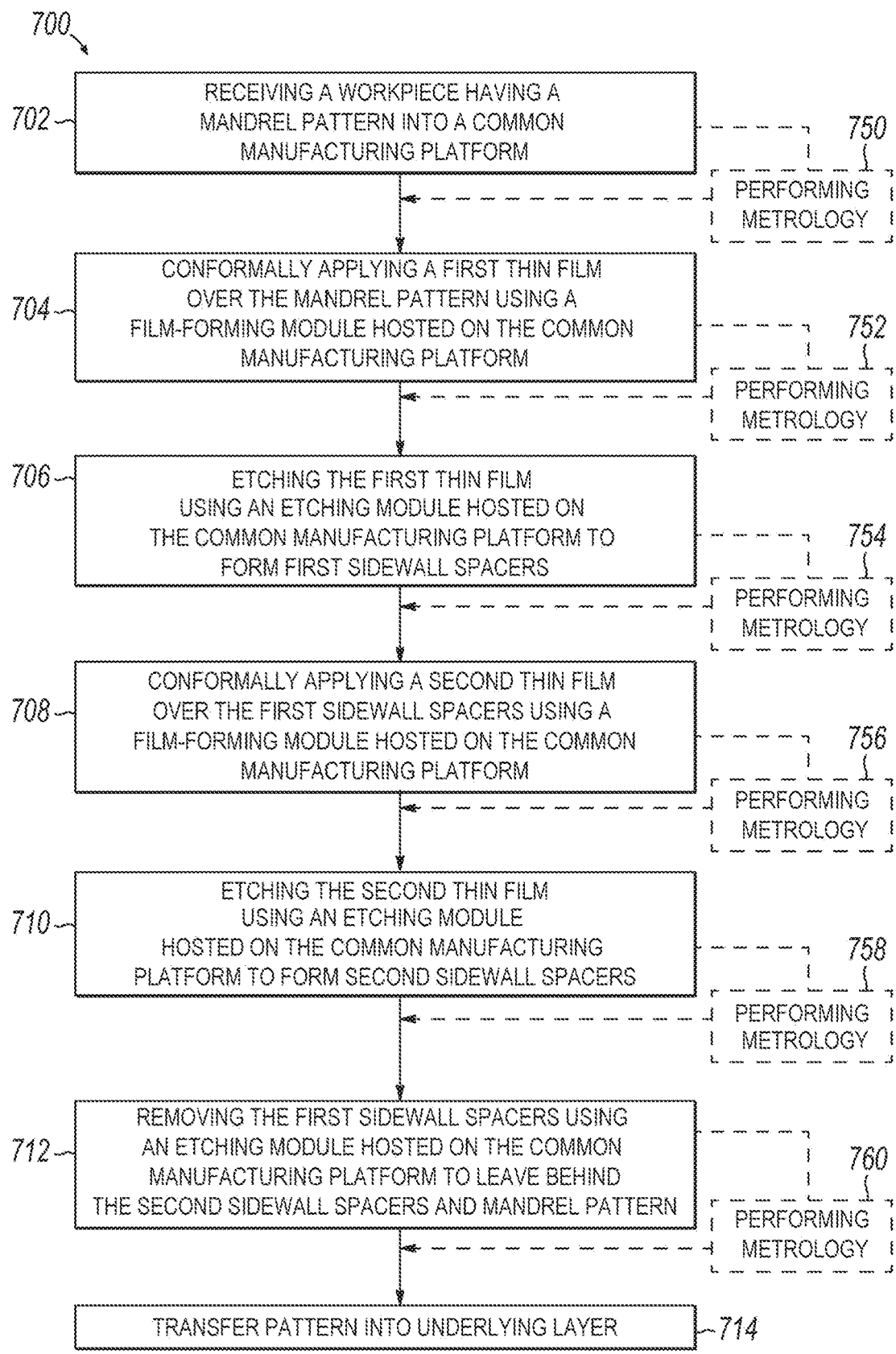
FIG. 7 is a flow chart diagram illustrating one embodiment of an integrated process flow for self-aligned multi-patterning.

FIGS. 6A-6G illustrate one embodiment of a self-aligned triple patterning (SATP) method for a workpiece, and FIG. 7 is a flow chart of a process flow 700 corresponding to the method of FIGS. 6A-6G. FIGS. 4 and 5, as discussed above, illustrate embodiments of a common manufacturing platform of the invention that may be used for performing process flow 700.

In operation 702 of process flow 700 and as shown in FIG. 6A, workpiece 600 having a first mandrel pattern 610 formed thereon is provided into the common manufacturing platform 400 or 500. The workpiece 600 may be as described above for workpiece 100. Similarly, for simplicity, workpiece 600 is depicted with a substrate 604 having an underlying layer 606 thereon into which a final pattern is to be transferred, and the mandrel pattern 610 is formed on the underlying layer 606, although it may be understood that the structure on which the mandrel pattern 610 is formed may be a multi-layer structure of which the underlying layer 606 is just one of multiple layers.

As shown in FIGS. 4 and 5, the transfer module 410 or 410a may be used to bring the workpiece 600 into the controlled environment of the common manufacturing platform 400 or 500, which controlled environment is maintained throughout the process flow 700. In the common manufacturing platform 400 or 500 of an embodiment of the invention, in operation 702, the workpiece 600, which has been received into the controlled environment, is loaded by the transfer module 410 or 410a into a film-forming module 420 hosted on the common manufacturing platform 400.

Referring to FIGS. 6B and 7, in operation 704, in the film-forming module 420, a first thin film 620 is conformally deposited over the mandrel pattern 610 and underlying layer 606. The first thin film 620 can comprise an oxide, a nitride, silicon, or any combination thereof, for example, silicon nitride, silicon oxide, or silicon oxynitride.

Then, without leaving the controlled environment, e.g., without breaking vacuum, transfer modules 410 or 410a and 410b are used to transfer the workpiece 600 to an etching module 430 hosted on the common manufacturing platform 400 or 500, e.g., in platform 400, transfer module 410a removes the workpiece 600 from film-forming module 420 and transfers it to transfer module 410b, which then delivers the workpiece into first etching module 430a. In operation 706, the first thin film 620 is etched in first etching module 430 or 430a to leave behind the first thin film 620 on sidewalls of the mandrel pattern 110, which remaining thin film 620 forms first sidewall spacers 622, as shown in FIG. 6C. For example, operation 706 may be a first spacer reactive ion etch (RIE) process that creates the first sidewall spacers 622.

Referring to FIGS. 6D and 7, in operation 708, and again without leaving the controlled environment, e.g., without breaking vacuum, a second thin film 630 is conformally deposited over the first sidewall spacers 622, mandrel pattern 610 and underlying layer 606. The second thin film 630 can comprise an oxide, a nitride, silicon, or any combination thereof, for example, titanium oxide. The deposition may be performed in the same film-forming module 420 used in operation 704 or in a second film-forming module 420 or 422 hosted on the common manufacturing platform 400 or 500. A transfer module 410 is used to transfer the workpiece 600 from the first etching module 430 to the second film-forming module 420 or 422 without breaking vacuum. It may be noted that common manufacturing platform 500 could be modified to add a film-forming module 420 in each of lines 440 and 450 between the first and second etching modules 430 to accommodate operation 708.

Then, without leaving the controlled environment, e.g., without breaking vacuum, one or more transfer modules 410 are used to transfer the workpiece 600 to a second etching module 430 hosted on the common manufacturing platform 400 or 500. In operation 710, the second thin film 630 is etched in second etching module 430 to leave behind the second thin film 630 on sidewalls of the first sidewall spacers 622, which remaining second thin film 630 forms second sidewall spacers 632, as shown in FIG. 6E. For example, operation 710 may be a second spacer reactive ion etch (RIE) process that creates the second sidewall spacers 632.

Then, without leaving the controlled environment, e.g., without breaking vacuum, one or more transfer modules 410 are used to transfer the workpiece 600 to a third etching module 430 hosted on the common manufacturing platform 400 or 500. In operation 712, a spacer pull process is then performed, the spacer pull process selectively removing the first sidewall spacers 622 leaving behind the remaining second thin film 630 that formed the second sidewall spacers 632 and the mandrel pattern 610, as shown in FIG. 6F. The spacer pull process may be performed in the same etching module 430 used in operation 706 or 710 or in another etching module 430 hosted on the common manufacturing platform 400 or 500. One or more transfer modules 410 are used to transfer the workpiece from one etching module to another etching module 430 without leaving the controlled environment and adjustments to the controlled environment may be made in the transfer modules if the third etching module 430 operates with different parameters than the second etching module, such as different vacuum pressures. With the first sidewall spacers 622 removed, the second sidewall spacers 632 and mandrel pattern 610 that remain form a new feature pattern with triple the number of features compared to the number of features or mandrels in the mandrel pattern 610, and with one third the pitch of the first mandrel pattern 610.

The second sidewall spacers 632 and mandrel pattern 610 may be used in an operation 714 in FIG. 7 to transfer the pattern into the underlying layer 606, to form the tripled pattern 608 in FIG. 6G.

Similar to the process flow 300 of FIG. 3, in the process flow 700 of FIG. 7, the method may include performing metrology using the active interdiction system at any of various times throughout the integrated method, without leaving the controlled environment, e.g., without breaking vacuum. The active interdiction system may include a single metrology module or workpiece measurement region on the common manufacturing platform 400 or 500 or may include multiple metrology modules or workpiece measurement regions on the common manufacturing platform 400 or 500. Each metrology operation is optional, as indicated by the phantom lines in FIG. 7, but may be advantageously performed at one or more points in the process flow to ensure the workpiece 600 is within specification to reduce defectivity and EPE.

Without duplicating the detail provided in the description of the process flow 300, process flow 700 will now be described briefly with the optional metrology operations. Operation 750 includes optionally performing metrology to obtain measurement data related to attributes of the incoming workpiece, such as attributes of the mandrel pattern and/or an underlying layer over which the mandrel pattern is formed and into which the final pattern is to be transferred, which measurement data may be used to adjust and/or control process parameters of any one of operations 704-714.

Operation 752 includes optionally performing metrology to obtain measurement data related to attributes of the workpiece having the conformal first thin film applied, such as attributes of the first thin film, the mandrel pattern as affected by the thin film deposition, and/or the underlying layer into which the final pattern is to be transferred as affected by the thin film deposition, which measurement data may be used to adjust and/or control process parameters of any one of operations 706-718, may be used to make adjustments for subsequent workpieces to the incoming attributes of the workpieces in operation 702 or to operation 704, or may be used to repair the workpiece before continued processing. In one embodiment, when the measurement data indicates that one or more attributes do not meet a target condition, the workpiece may be transferred to a correction module to repair the conformally applied first thin film, as described above.

Operation 754 includes optionally performing metrology to obtain measurement data related to attributes of the workpiece having the etched first thin film forming first sidewall spacers on the sidewalls of the mandrel pattern, such as attributes of the first sidewall spacers, the mandrel pattern as affected by the spacer etch, and/or the underlying layer as affected by the spacer etch, which measurement data may be used to adjust and/or control process parameters of any one of operations 708-714, may be used to make adjustments for subsequent workpieces to the incoming attributes of the workpieces in operation 702 or to operations 704-706, or may be used to repair the workpiece before continued processing. In one embodiment, when the measurement data indicates that one or more attributes do not meet a target condition, the workpiece may be transferred to a correction module to repair the first sidewall spacers on the sidewalls of the mandrel pattern, as described above.

Operation 756 includes optionally performing metrology to obtain measurement data related to attributes of the workpiece having the conformal second thin film applied, such as attributes of the second thin film, the mandrel pattern as affected by the thin film deposition, the first sidewall spacers as affected by the thin film deposition, and/or the underlying layer as affected by the thin film deposition, which measurement data may be used to adjust and/or control process parameters of any one of operations 710-714, may be used to make adjustments for subsequent workpieces to the incoming attributes of the workpieces in operation 702 or to operations 704-708, or may be used to repair the workpiece before continued processing. In one embodiment, when the measurement data indicates that one or more attributes do not meet a target condition, the workpiece may be transferred to a correction module to repair the conformally applied second thin film, as described above.

Operation 758 includes optionally performing metrology to obtain measurement data related to attributes of the workpiece having the etched second thin film forming second sidewall spacers on the sidewalls of the first sidewall spacers, such as attributes of the second sidewall spacers, the first sidewall spacers as affected by the spacer etch, the mandrel pattern as affected by the spacer etch, and/or the underlying layer as affected by the spacer etch, which measurement data may be used to adjust and/or control process parameters of any one of operations 712-714, may be used to make adjustments for subsequent workpieces to the incoming attributes of the workpieces in operation 702 or to operations 704-710, or may be used to repair the workpiece before continued processing. In one embodiment, when the measurement data indicates that one or more attributes do not meet a target condition, the workpiece may be transferred to a correction module to repair the second sidewall spacers on the sidewalls of the first sidewall spacers, as described above.

Operation 760 includes optionally performing metrology to obtain measurement data related to attributes of the workpiece having the second sidewall spacers and mandrel pattern, such as attributes of the second sidewall spacers as affected by the spacer pull, the mandrel pattern as affected by the spacer pull, and/or the underlying layer as affected by the spacer pull, which measurement data may be used to adjust and/or control process parameters of operation 714, may be used to make adjustments for subsequent workpieces to the incoming attributes of the workpieces in operation 702 or to operations 704-712, or may be used to repair the workpiece before continued processing. In one embodiment, when the measurement data indicates that one or more attributes do not meet a target condition, the workpiece may be transferred to a correction module to repair the second sidewall spacers and/or mandrel pattern that form the tripled feature pattern.

As disclosed herein the term "metrology module" or "measurement module" refers to a module/system/sensor/tool that can make measurements on a workpiece to detect or determine various non-conformities or variations on the workpiece, such as parametric variations, or to detect or determine defects on the workpiece, such as a contamination of some kind. As used herein, the term "inspection system" will generally refer to the tool or system of a measurement process or module that measures and collects data or signals associated with the measurement. The measurement modules will make measurements and provide data for use in the processing platform as disclosed further herein. The terms "metrology module" and "measurement module" will be used interchangeably herein, and generally refer to measurement or metrology or sensing tools used to detect and measure attributes of a workpiece that are indicative of the processing of the workpiece and the layers and devices being formed thereon.

To move workpieces between the various processing modules, the common manufacturing platform will generally incorporate one or more workpiece transfer modules that are hosted on the common manufacturing platform and are configured for the movement of the workpiece between the processing modules and the measurement module(s). A measurement module might be coupled with the workpiece transfer module similar to a processing module. In some embodiments of the invention, as disclosed herein, a measurement module or the inspection system associated therewith is incorporated with or inside a transfer module to provide for measurement or metrology as the workpiece is moved between processing modules. For example, a measurement module, or a portion thereof, might be positioned inside an internal space of the transfer module. Herein, the combination transfer and measurement apparatus will be referred to as a transfer measurement module ("TMM").

In one embodiment, the common manufacturing platform including both processing chambers and measurement modules is actively controlled by a system that processes the measured data associated with an attribute on the workpiece and uses the measured data for controlling movement and processing of the workpiece in a processing sequence. In accordance with embodiments of the invention, the control system uses measured data and other data to perform corrective processing based in part on the measured data to provide active interdiction of the processing sequence to correct non-conformities or defects. More specifically, an active interdiction control system is hosted on the common manufacturing platform and is configured to perform corrective processing based in part on the measured data, wherein the corrective processing of the workpiece might be performed in the processing modules of the platform that are upstream or downstream in the process sequence to address situations where non-conformities or defects are detected. In an embodiment of the invention, the workpiece is maintained in a controlled environment, such as under vacuum, for example. That is, on the common manufacturing platform, the processing modules and the measurement module operate in a controlled environment, and the workpiece transfer module transfers the workpiece between the plurality of processing modules in the processing sequence and one or more measurement modules without leaving the controlled environment.

As used herein, the term "active interdiction" refers generally to the control system as implemented for capturing measurement/metrology data in real time with respect to various fabrication processes to obtain data on workpiece attributes and thereby detect non-conformities or defects and the corrective aspects of the control to correct or ameliorate the non-conformities or defects. The active interdiction control system uses the data for correction and amelioration of various non-conformities in the semiconductor fabrication process by actively varying the processing sequence and/or the operation of modules that perform process steps. Thus, the active interdiction control system also interfaces with one or more transfer modules (e.g., 410) used to move workpieces through the process. The active interdiction control system (822 in FIGS. 8 and 922 in FIGS. 9A-9D, as further described below) coordinates the data collection and data analysis and detection of non-conformities with the fabrication process and further directs the actions of multiple processing modules so as to address the non-conformities or defects that are detected. The active interdiction control system is implemented generally by one or more computer or computing devices as described herein that operate a specially designed sets of programs such as deep learning programs or autonomous learning components referred to collectively herein as active interdiction components. As may be appreciated, the active interdiction control system may incorporate multiple programs/components to coordinate the data collection from various measurement modules and the subsequent analysis. The active interdiction control system interfaces with the multiple processing modules in the common manufacturing platform in order to address various measured non-conformities/defects to correct or ameliorate the non-conformities/defects. The active interdiction control system will thereby control one or more of the processing modules and the processing sequence to achieve the desired results of the invention, which may be referred to as the target conditions or predetermined thresholds.

The active interdiction control system also controls the transfer modules in order to move the workpieces to upstream and/or downstream processing modules when non-conformities/defects are detected. That is, depending upon what is detected, the system of the invention may move the workpiece further along in the processing sequence, or may direct the workpiece to a correction module or to an upstream processing module to correct or otherwise address a detected non-conformity or defect. As such, feedforward and feedback mechanisms are provided through the transfer modules to provide the active interdiction of the invention. Furthermore, the processing sequence might be affected upstream or downstream for future workpieces.

The active interdiction features of the invention improve performance, yield, throughput, and flexibility of the manufacturing process using run-to-run, wafer-to-wafer, within the wafer and real-time process control using collected measurement/metrology data. The measured data is collected, in real time during the processing, without removing the workpiece/substrate/wafer from the controlled processing environment. In accordance with one feature of the invention, in a common manufacturing platform, the measurement data may be captured while the substrate remains in a controlled environment, such as under vacuum, for example. That is, the workpiece transfer module(s) are configured for transferring the workpiece between the plurality of processing modules and the measurement modules without leaving the controlled environment. The active interdiction control can provide a multivariate, model-based system that is developed in conjunction with feed-forward and feedback mechanisms to automatically determine the optimal recipe for each workpiece based on both incoming workpieces and module or tool state properties. The active interdiction control system uses fabrication measurement data, process models and sophisticated control algorithms to provide dynamic fine-tuning of intermediate process targets that enhance final device targets. The interdiction system enables scalable control solutions across a single chamber, a process tool, multi-tools, a process module and multi-process modules on a common manufacturing platform using similar building blocks, concepts, and algorithms as described herein.

Figure 8:
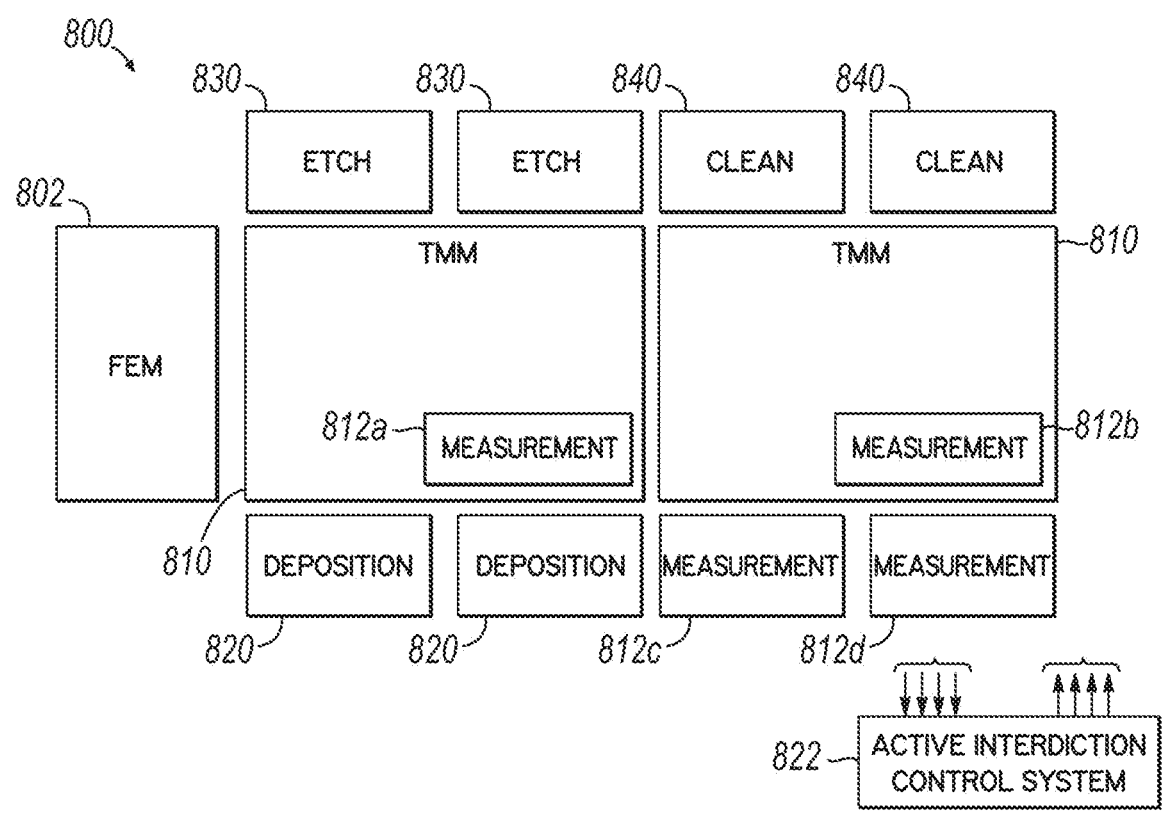
FIG. 8 is a schematic diagram illustrating one embodiment of a common manufacturing platform for performing an integrated sequence of processing steps.

FIG. 8 is a schematic diagram of another system for implementing an embodiment of the present invention on a common manufacturing platform 800. The platform 800 incorporates a plurality of processing modules/systems for performing integrated workpiece processing and workpiece measurement/metrology under the control of an active interdiction control system 822 according to embodiments of the invention. FIG. 8 illustrates an embodiment of the invention wherein one or more workpiece measurement modules are coupled together with one or more workpiece processing modules through one or more transfer modules. In that way, in accordance with features of the invention, an inspection of the workpiece may be made to provide the measurement data associated with an attribute of the workpiece, such as regarding material properties of the workpiece and the various thin films, layers and features that are formed on the workpiece while the workpiece remains within the common manufacturing platform. As discussed herein, measurements and analysis may be made immediately upon completion of processing steps, such as an etch or deposition step, and the measurement data gathered may be analyzed and then used within the common manufacturing platform to address any measurements or features that are out of specification or non-conformal or represent a defect with respect to the workpiece design parameters. The workpiece does not need to be removed from the common manufacturing platform to take corrective action, but rather, can remain under the controlled environment.

Referring to FIG. 8, common manufacturing platform 800 is diagrammatically illustrated. Platform 800 includes a front-end module 802 for introducing one or more workpieces into the manufacturing platform. As is known, the front-end module (FEM) may incorporate one or more cassettes holding the workpieces. The front-end module may be maintained at atmospheric pressure but purged with an inert gas to provide a clean environment. One or more workpieces may then be transferred into a transfer module 810, such as through one or more load-lock chambers (not shown) as discussed herein. The transfer modules of FIG. 8 are transfer measurement modules (TMM) that include measurement tools or inspection systems integrated therein for capturing data from a workpiece. Multiple TMM's 810 may be interfaced for providing movement of a workpiece through a desired sequence. The transfer measurement modules 810 are coupled with a plurality of processing modules.

Such processing modules may provide various different processing steps or functions and may include one or more etch modules 830, one or more film-forming modules 820, one or more cleaning modules 840, and one or more measurement modules 812a, 812b, 812c, 812d. In accordance with embodiments of the invention as disclosed further herein, measurement modules may be accessed through the transfer modules 810 before or after each processing step. In one embodiment, the measurement modules, such as 812c, 812d, are located outside of the transfer modules 810 and are accessed to insert and receive workpieces similar to the various processing modules and may be referred to herein as metrology modules that reside within the controlled environment of the common manufacturing platform 800. Alternatively, measurement modules or at least a portion thereof, such as modules 812a, 812b, may be located in a respective transfer module. More specifically, all or a portion of a measurement module 812a, 812b is located in a transfer module 810 to define a measurement region therein where a workpiece might be positioned for measurement during a transfer process. The measurement region is located in a dedicated area of the transfer module 810 and is accessible by the transfer mechanism of the transfer module for positioning the workpiece. As noted, this makes the transfer module essentially a transfer measurement module (TMM) as discussed herein.

Generally, the transfer module defines a chamber therein that houses a transfer robot that is capable of moving workpieces, under vacuum, through various gate valves and access or transfer ports into various processing modules or measurement modules. By maintaining the measurement modules on the common manufacturing platform 800, they are readily accessed, such as between one or more of the processing steps to provide the necessary measured analytical data on-the-fly that will be used to address any workpiece out of specification or otherwise non-conformal with the workpiece design plans for a particular workpiece or to address detectable defects. In that way, real time data is provided to allow a fabricator to recognize problems early in the system so that remedial action may be taken in the current processing sequence, such as in a following processing step, in a previous processing step, and/or in a future processing step depending upon the captured data and the detected non-conformities or defects. In that way, productivity and efficiency may be increased, process monitoring overhead may be reduced, and wasted product, in the form of rejected or ejected workpieces may be reduced. This all provides a significant cost savings to a fabricator or device maker.

As noted, in one embodiment of the invention that incorporates the active interdiction control system 822, one or more measurement modules are hosted on a common manufacturing platform with processing modules for providing measured data regarding an attribute of the workpiece. The data is used by the active interdiction control system 822 for detecting non-conformities and for performing corrective processing of the workpiece when non-conformities are detected. The corrective processing is performed upstream and/or downstream in the process sequence when non-conformities are detected.

Figure 9A:
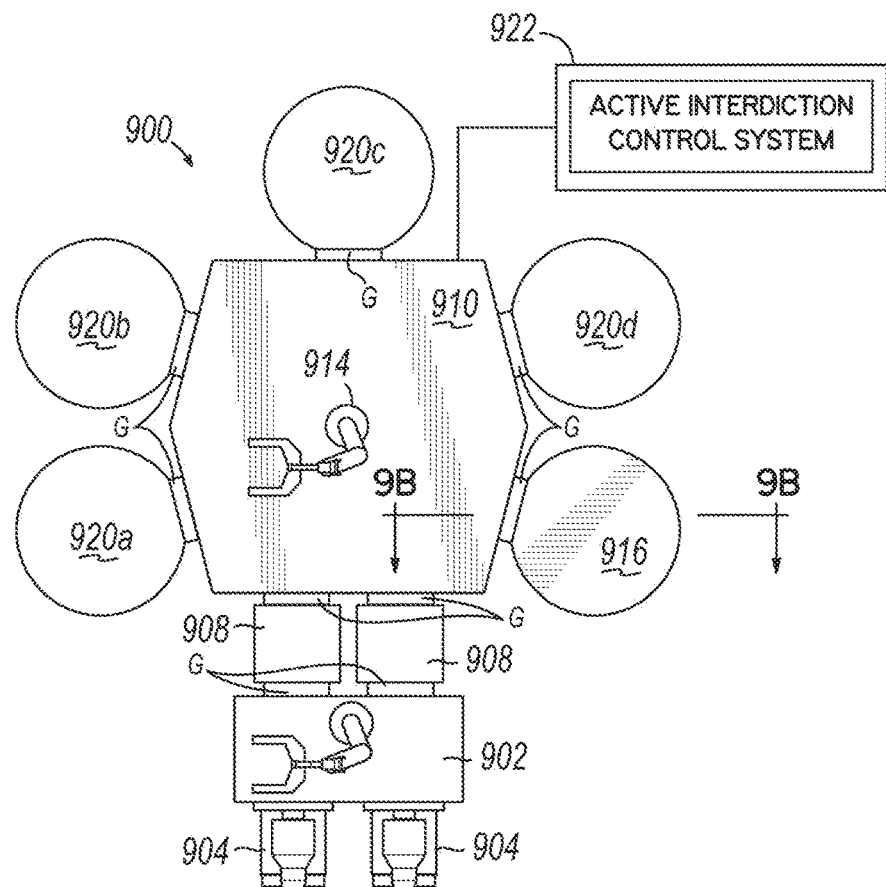
FIG. 9A is a schematic diagram illustrating in top view another embodiment of a common manufacturing platform for performing an integrated sequence of processing steps.

Referring to FIG. 9A, an exemplary common manufacturing platform 900 suitable for practicing a method of ASD is illustrated. The common manufacturing platform 900 incorporates multiple modules and processing tools for the processing of semiconductor substrates for the fabrication of integrated circuits and other devices. The common manufacturing platform 900 incorporates one or more metrology/ measurement modules that are incorporated within the common manufacturing platform 900 along with the processing modules. For example, the platform 900 may incorporate a plurality of processing modules that are coupled to a transfer module as shown. In some embodiments, a measurement module or tool is also positioned, at least partially, inside the transfer module. As such, a workpiece may be processed and then transferred immediately to a measurement module in order to collect various fabrication data associated with attributes of the workpiece that is further processed by the active interdiction control system. The active interdiction control system gathers data from the processing and measurement modules and controls a process sequence that is executed on the common manufacturing platform through the selective movement of the workpiece and control of one or more of the plurality of processing modules. Furthermore, the processing system of platform 900 may transfer a workpiece inside the chamber of the transfer module and between the various processing modules and the measurement/metrology modules without leaving the controlled environment of the common manufacturing platform 900. The active interdiction control system controls the sequential process flow through the various processing modules utilizing information that is derived from workpiece measurements obtained from the one or more measurement modules. Furthermore, the active interdiction control system incorporates processing modules in-situ measurements and data to control the sequential process flow through the platform 900. The on-substrate measurement data obtained in the controlled environment may be utilized alone or in combination with the in-situ processing module measurement data for process flow control and improvement of the process in accordance with the invention.

Turning again to FIG. 9A, common manufacturing platform 900 contains a front-end module 902 to introduce workpieces into the controlled environment. The exemplary platform 900 includes a plurality of processing modules 920a-920d and one or more measurement/metrology modules 916 organized around the periphery of a workpiece transfer module 910. Common manufacturing platform 900 includes cassette modules 904 and load-lock chambers 908 coupled to front-end module 902. The front-end module 902 is generally maintained at atmospheric pressure, but a clean environment may be provided by purging with an inert gas. Load-lock chambers 908 are coupled to the centralized workpiece transfer module 910 and may be used for transferring workpieces from the front-end module 902 to the workpiece transfer module 910 for processing in the controlled environment of the platform 900.

The workpiece transfer module 910 may be maintained at a very low base pressure (e.g., 5×10-8 Torr, or lower) or constantly purged with an inert gas. In accordance with the invention, a measurement/metrology module 916 may be operated under atmospheric pressure or operated under vacuum conditions. In accordance with one embodiment, the measurement module 916 is kept at vacuum conditions and the wafer is processed in platform 900 and measured without leaving vacuum. As disclosed further herein, the metrology module may include one or more inspection systems or analytical tools that are capable of measuring one or more material properties or attributes of a workpiece and/or of the thin films and layers deposited on the workpiece or the devices formed on the workpiece. As used herein, the term "attribute" is used to indicate a measurable feature or property of a workpiece, layer on a workpiece, feature or device on a workpiece, etc. that is reflective of the processing quality of the processing sequence. The measured data associated with an attribute is then used to adjust the process sequence by analyzing the measured data along with other in-situ processing data through the active interdiction control system. For example, the measured attribute data reflects non-conformities or defects on the workpiece for providing corrective processing.

FIG. 9A illustrates essentially a single measurement module 716. However, the particular common manufacturing platform 900 may incorporate a plurality of such measurement modules that are incorporated around one or more workpiece transfer systems, such as the workpiece transfer module 910. Such measurement modules 916 may be stand-alone modules that are accessed through the transfer module 910 like a processing module. Such stand-alone modules will generally incorporate inspection systems therein that are configured to engage a workpiece that is positioned in a measurement region of the module and to measure data associated with an attribute of the workpiece.

In an alternative embodiment of the invention, a measurement module might be implemented in a measurement region located within a dedicated area of an internal space of the transfer chamber defined by the transfer module 910. Still further, a measurement module might be incorporated wherein at least a portion of the measurement module is positioned inside of an internal space of a workpiece transfer module, and other components of the measurement module or the specific inspection system of the measurement module are incorporated outside of the workpiece transfer module and interfaced through an aperture or window into a dedicated area of the internal space that forms the measurement region in which a workpiece is located or through which a workpiece will pass.

The measurement modules of the inventive system and platform include one or more inspection systems that are operable for measuring data associated with an attribute of the workpiece. Such data may be associated with one or more attributes that reflect the quality of the processing sequence and the quality of the layers and features and devices that are being formed on a workpiece. The collected measurement data is then analyzed, along with processing module data, by an active interdiction control system for detecting various non-conformities and/or defects on the workpiece or workpiece layers/features. The system then provides for corrective processing of the workpiece, such as in upstream or downstream processing modules in the process sequence to ameliorate/correct the non-conformities or defects and improve the overall process.

In accordance with embodiments of the invention, the measurements taken by the measurement module or inspection systems thereof and the data generated is associated with one or more attributes of a workpiece. For example, the attribute measured may include, for example, on or more of: a layer thickness, a layer conformality, a layer coverage, a layer profile of a layer on the workpiece, an edge placement location, an edge placement error (EPE) for certain features, a critical dimension (CD), a block critical dimension (CD), a grid critical dimension (CD), a line width roughness (LWR), a line edge roughness (LER), a block LWR, a grid LWR, a property relating to selective deposition process(es), a property relating to selective etch process(es), a physical property, an optical property, an electrical property, a refractive index, a resistance, a current, a voltage, a temperature, a mass, a velocity, an acceleration, or some combination thereof associated with the fabricated electronic devices on the workpiece. The list of measured attributes for generating measurement data for the invention is not limited and could include other attribute data that might be used for processing a workpiece and fabricating devices.

As further discussed herein, the measurement modules and/or inspections systems used for providing attribute data may implement a number of tools and methods for measurement for providing the measurement and metrology of the invention. The measurement modules and/or inspections systems may include optical methods, or non-optical methods. Optical methods can include high-resolution optical imaging and microscopy (e.g., bright-field, dark-field, coherent/incoherent/partially coherent, polarized, Nomarski, etc.), hyperspectral (multi-spectral) imaging, interferometry (e.g., phase shifting, phase modulation, differential interference contrast, heterodyne, Fourier transform, frequency modulation, etc.), spectroscopy (e.g., optical emission, light absorption, various wavelength ranges, various spectral resolutions, etc.), Fourier transform Infrared spectroscopy (FTIR) reflectometry, scatterometry, spectroscopic ellipsometry, polarimetry, refractometers, etc. Non-optical methods can include electronic methods (e.g., RF, microwave, etc.), acoustic methods, photo-acoustic methods, mass spectroscopy, residual gas analyzers, scanning electron microscopy (SEM), transmission electron microscopy (TEM), atomic force microscopy (AFM), energy dispersive x-ray spectroscopy (EDS), x-ray photo-emission spectroscopy (XPS), etc. For example, the inspection system used for measuring data that is associated with an attribute of the workpiece may use one or more of the following techniques or devices: optical thin film measurement, such as reflectometry, interferometry, scatterometry, profilometry, ellipsometry; X-Ray measurements, such as X-ray photo-emission spectroscopy (XPS), X-Ray fluorescence (XRF), X-Ray diffraction (XRD), X-Ray reflectometry (XRR); ion scattering measurements, such as ion scattering spectroscopy, low energy ion scattering (LEIS) spectroscopy, auger electron spectroscopy, secondary ion mass spectroscopy, reflection absorption IR spectroscopy, electron beam inspection, particle inspection, particle counting devices and inspection, optical inspection, dopant concentration metrology, film resistivity metrology, such as a 4-point probe, eddy current measurements; a micro-balance, an accelerometer measurement, a voltage probe, a current probe, a temperature probe for thermal measurements, or a strain gauge. The list of measurement techniques or devices for generating measurement data for the invention is not limited and could include other techniques or devices that might be used for obtaining the useful data for processing a workpiece and fabricating devices in accordance with the invention.

The measurement modules and/or inspection systems may take measurements on various substrate or workpiece structures passed through the processing system including either product workpieces, or non-product substrates, i.e., a monitoring substrate. On product workpieces, measurements can be performed on designated target structures, both device-like structures and device-unlike structures, on specified device areas, or on arbitrary areas. The measurements may also be performed on test structures created on the workpiece, that might include pitch structures, area structures, density structures, etc.

Referring again to FIG. 9A, coupled to the transfer chamber 910 are a plurality of processing modules 920a-920d that are configured for processing substrates, such as semiconductor or silicon (Si) workpieces. The Si workpieces can, for example, have a diameter of 150 mm, 200 mm, 300 mm, 450 mm, or larger than 450 mm. The various processing modules and measurement modules all interface with the workpiece transfer module 910 through appropriate gate access ports with valves G, for example. According to one embodiment of the invention disclosed herein, the first processing module 920a might perform a treatment process on a workpiece, and the second processing module 920b might form a self-aligned monolayer (SAM) on a workpiece. The third processing module 920c may deposit a film on a workpiece by a suitable selective deposition process, and the fourth processing module 920d may selectively etch or clean a workpiece.

The transfer module 910 is configured for transferring workpieces between any of the processing modules 920a-920d and then into the metrology module 916 either before or after a particular processing step. FIG. 9A further shows the gate valves G that provide isolation at the access ports between adjacent processing chambers/tool components. As depicted in the embodiment of FIG. 9A, the processing modules 920a-920d and the metrology module 916 may be directly coupled to the transfer chamber 910 by the gate valves G and such direct coupling can greatly improve substrate throughput in accordance with the invention.

The common manufacturing platform 900 includes one or more controllers or control systems 922 that can be coupled to control the various processing modules and associated processing chambers/tools depicted in FIG. 9A during the integrated processing and measurement/metrology process as disclosed herein. The controller/control system 922 can be coupled to one or more additional controllers/computers/databases (not shown) as well. Control system 922 can obtain setup and/or configuration information from an additional controller/computer or a server over a network. The control system 922 is used to configure and run any or all of the processing modules and processing tools and to gather data from the various measurement modules and in-situ data from the processing modules to provide the active interdiction of the invention. The controller 922 collects, provides, processes, stores, and displays data from any or all of the processing modules and tool components. The control system 922, as described further herein, can comprise a number of different programs and applications and processing engines to analyze the measured data and in-situ processing data and to implement algorithms, such as deep learning networks, machine learning algorithms, autonomous learning algorithms and other algorithms for providing the active interdiction of the invention.

As described further herein, the active interdiction control system 922 can be implemented in one or more computer devices having a microprocessor, suitable memory, and digital I/O port and is capable of generating control signals and voltages that are sufficient to communicate, activate inputs to the various modules of the platform 900, and exchange information with the substrate processing systems run on the platform 900. The control system 922 monitors outputs from the processing system of the platform 900 as well as measured data from the various measurement modules of the platform to run the platform. For example, a program stored in the memory of the control system 922 may be utilized to activate the inputs to the various processing systems and transfer systems according to a process recipe or sequence in order to perform desired integrated workpiece processing.

The control system 922 also uses measured data as well as in-situ processing data output by the processing modules to detect non-conformities or defects in the workpiece and provide corrective processing. As discussed herein, the control system 922 may be implemented as a general-purpose computer system that performs a portion or all of the microprocessor-based processing steps of the invention in response to a processor executing one or more sequences of one or more instructions contained in a program in memory. Such instructions may be read into the control system memory from another computer readable medium, such as a hard disk or a removable media drive. One or more processors in a multi-processing arrangement may also be employed as the control system microprocessor element to execute the sequences of instructions contained in memory. In alternative embodiments, hard-wired circuitry may be used in place of or in combination with software instructions for implementing the invention. Thus, embodiments are not limited to any specific combination of hardware circuitry and software for executing the metrology driver processes of the invention as discussed herein.

The active interdiction control system 922 may be locally located relative to the platform 900, or it may be remotely located relative to the platform 900. For example, the controller 922 may exchange data with the platform 900 using at least one of a direct connection, an intranet connection, an Internet connection or a wireless connection. The control system 922 may be coupled to an intranet at, for example, a customer site (i.e., a device maker, etc.), or it may be coupled to an intranet at, for example, a vendor site (i.e., an equipment manufacturer). Additionally, for example, the control system 922 may be coupled to other systems or controls through an appropriate wired or wireless connection. Furthermore, another computer (i.e., controller, server, etc.) may access, for example, the control system 922 to exchange data via at least one of a direct wired connection or a wireless connection, such as an intranet connection, and/or an Internet connection. As also would be appreciated by those skilled in the art, the control system 922 will exchange data with the modules of the common manufacturing platform 900 via appropriate wired or wireless connections. The processing modules may have their own individual control systems (not shown) that take input data for control of the processing chambers and tools and subsystems of the modules and provide in-situ output data regarding the process parameters and metrics during the processing sequence.

Figure 9B:
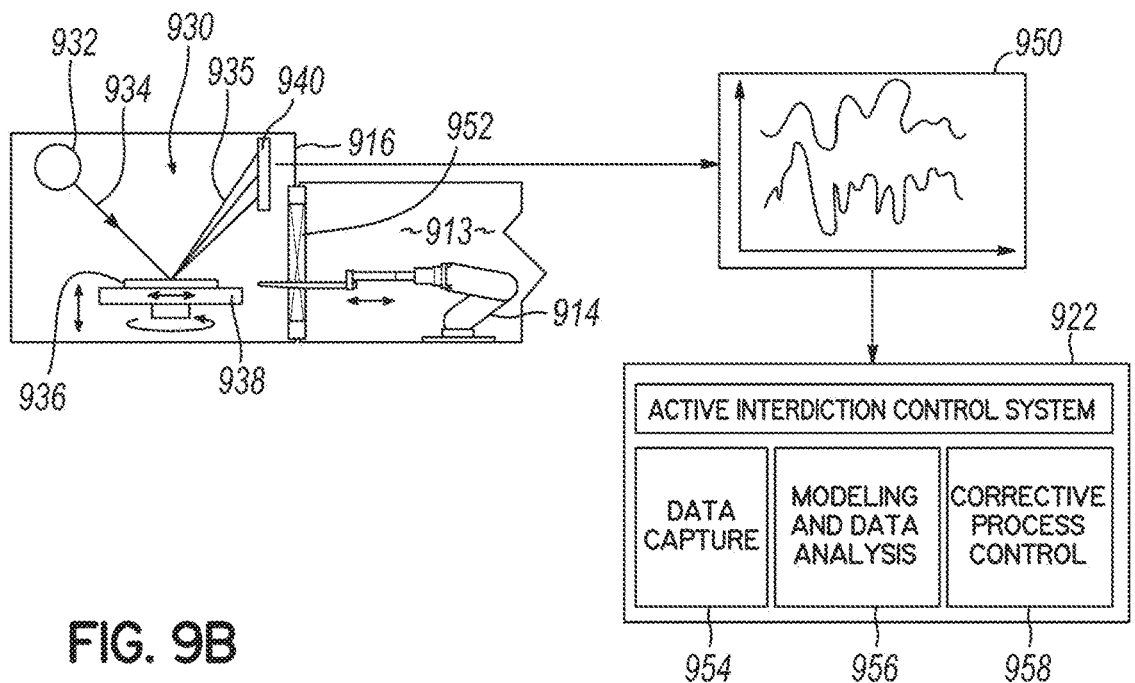
FIG. 9B is a side view in partial cross-section of a measurement module incorporated in the common manufacturing platform of FIG. 9A.

With specific reference to FIGS. 9A and 9B, and in accordance with one embodiment, measurement data may be obtained in a measurement/metrology module 916 that is a separate module on the platform 900 coupled to the transfer module 910. Generally, the transfer module 910 has a chamber that incorporates one or more transfer mechanisms or robots 914 that will handle and move workpieces through the internal space of the chamber and into and out of the processing module in the processing sequence.

More specifically, the transfer mechanism 914 is positioned inside of the internal space 913 of the transfer module 910 that can define a controlled environment and is configured for moving the workpieces through the internal space and environment and selectively in and out of the plurality of processing modules 920a-920d and the measurement modules 916 or into and out of a measurement region in a dedicated area of the internal space in order for a measurement inspection system to measure data. In accordance with one feature of the invention, because the internal space 913 of the transfer module 910 and processing modules 920a-920d and measurement modules 916 are coupled together on the common manufacturing platform 900, the controlled environment may be maintained for the workpiece generally through most of or all of the measurement and processing sequence. Such a controlled environment could involve a vacuum environment or an inert gas atmosphere in the transfer module or measurement module.

Figure 9C:
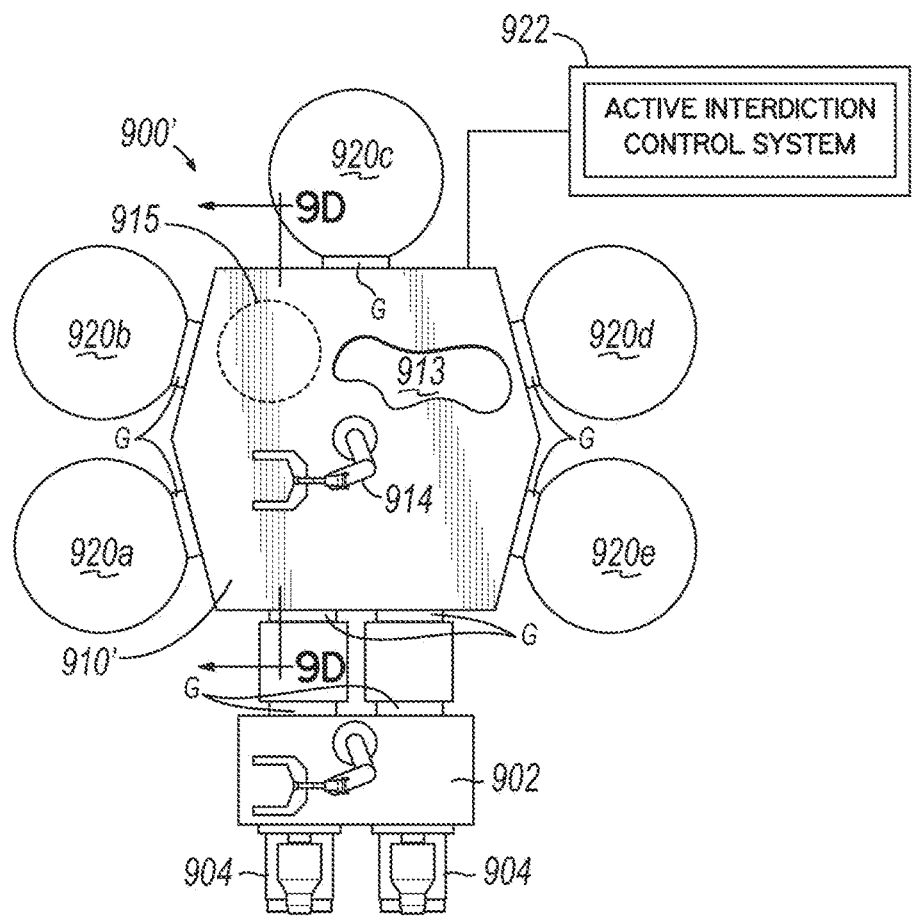
FIG. 9C is a schematic diagram illustrating in top view another embodiment of a common manufacturing platform for performing an integrated sequence of processing steps.
Figure 9D:
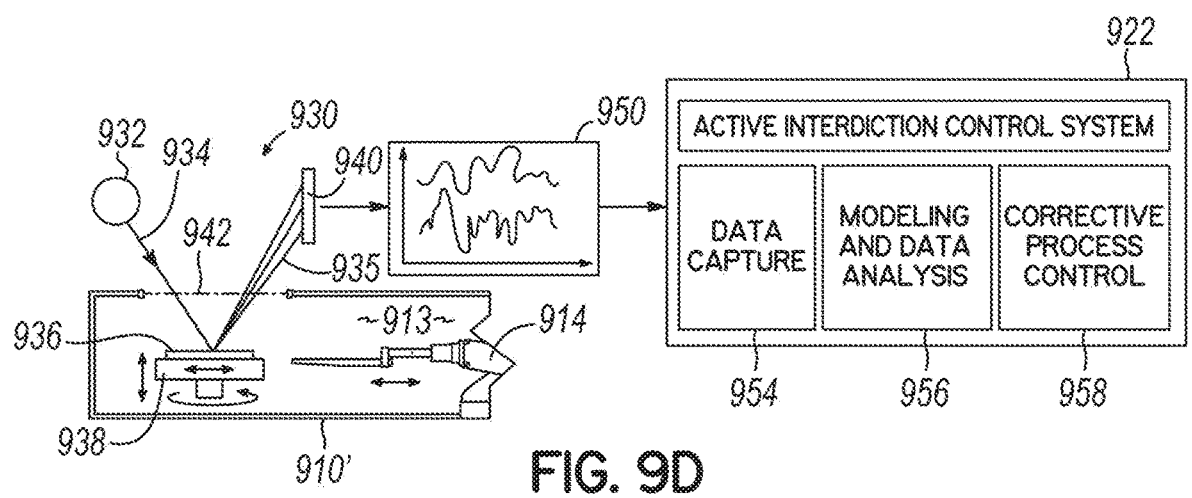
FIG. 9D is a side view in partial cross-section of a measurement module incorporated in the common manufacturing platform of FIG. 9C.

The transfer module 910 includes a plurality of access ports or side ports, each with a suitable gate G, through which a workpiece is moved to and from the plurality of processing modules 920a-920d. To provide the necessary processing sequence for efficient through-put on platform 900, the plurality of processing modules 920a-920d includes modules that handle a variety of workpiece processing steps on the common platform, including one or more etching modules and one or more film-forming or deposition modules. The measurement module 916, as illustrated in FIG. 7A is coupled with the transfer module 910 also at one of the side or access ports through a suitable gate G. In other embodiments, the measurement module is coupled with the transfer module at a port formed in the top of the transfer module. In still further embodiments as described herein, the transfer module acts as a measurement module as well wherein at least a portion of the measurement module for capturing measurement data is incorporated or positioned inside of an internal space of the transfer module. The transfer measurement module (TMM) in such an embodiment, as illustrated in FIGS. 9C-9D, includes a measurement region located within a dedicated area of the internal space of the transfer module.

The active interdiction control system 922 collects workpiece measurement data generally on-the-fly as the substrate moves in the processing sequence between one or more of the processing modules and the measurement/metrology module 916. The data is captured and then analyzed and processed to detect non-conformities and defects and provide corrective processing as discussed herein. The active interdiction control system 922 provides the necessary control of the processing steps of the sequence to make control adjustments to various fabrication processing steps as performed in order to correct for the detected non-conformities/defects. Adjustments may be made to process steps and processing modules that precede or are upstream of the captured measurement data and/or process steps that follow or are downstream of the measurement data in sequence. Alternatively, a suitable corrective action or corrective processing might include ejection of the workpiece from the platform 900 in order to not waste further time and materials on a workpiece which cannot be saved.

Referring to FIG. 9B, one exemplary measurement module 916 is illustrated that incorporates an inspection system 930 for making measurements on the workpiece in real-time with respect to the processing sequence executed on common manufacturing platform 900.

The inspection system 930 measures data associated with an attribute of the workpiece, as discussed herein. The inspection system 930 incorporates one or more signal sources 932 that direct a measurement signal 934 toward a workpiece 936. Incident signals 934 are reflected or scattered from the surface of the workpiece 936 and the scattered signals 935 are captured by the detector 940. The detectors 940 generate measurement data 950 which may then be directed to the active interdiction control system 922 as described herein. In one embodiment, the workpiece 936 is positioned by transfer mechanism 914 on a measurement platform 938 that may be translated side-to-side and up and down and rotated as indicated by the arrows in FIG. 9B so that a measurement signal 934 may be directed to various proper positions on the workpiece 936.

That is, in the embodiment of FIG. 9B, the measurement module includes a separate support mechanism 938 for supporting a workpiece 936 positioned in the measurement module 916. The inspection system engages the support mechanism 938 for measuring data associated with a workpiece attribute supported on the support mechanism. In such a scenario, the support mechanism 938 in the measurement module 916 is generally separate from the transfer mechanism that otherwise moves the workpiece 936 and positions it on the support mechanism.

The separate support mechanism translates the workpiece 936, such as through vertical and/or horizontal movement and also may rotate the workpiece 936 to provide at least two degrees of freedom for measuring data associated with an attribute of the workpiece 936 as discussed herein. The support mechanism may also incorporate a temperature control element therein for controlling workpiece temperature. Therefore, in the embodiment of FIG. 9B, the support mechanism provides the support and movement of the workpiece 936 necessary for the measurement of data after the workpiece 936 is positioned thereon by the transfer mechanism. In an alternative embodiment, the transfer mechanism may provide the function of supporting and moving the workpiece 936 for engagement with the inspection system 930 for measuring data associated with an attribute on the workpiece 936.

The captured measurement data 950 may then be directed to control system 922 and further evaluated and analyzed to determine a particular action for the measured workpiece. If the measurement data indicates that the measured parameters are within specification of the desired design and fabrication process, and/or there are no actionable detected defects, the workpiece may proceed as normal through the process flow within the platform 900. Alternatively, if the measured data 950 indicates that the workpiece is beyond correction or amelioration, the workpiece might be ejected from further processing. Alternatively, in accordance with an embodiment of the invention, the active interdiction control system 922 may analyze the data and provide corrective processing as one or more corrective steps to be taken for that workpiece or to be made in various process steps of the overall process flow in order to correct the current workpiece, and also to prevent the need for corrective action in other workpieces that are subsequently processed on the platform 900. Specifically, referring to FIG. 9B, the active interdiction control system 922 may incorporate one or more processing steps and processing components therein for yielding correction to the process flow. First, the necessary measurement data 950 may be captured and pre-processed as illustrated by block 954. Next, modeling and data analysis occurs on the captured data as well as any in-situ processing data associated with one or more of the processing modules and process steps as indicated by block 956. The modeling and analysis may utilize artificial intelligence, including deep learning and autonomous learning programs and components. Next, the analysis may provide corrective process control wherein one or more of the processing steps and processing modules are controlled to correct or ameliorate perceived or detected non-conformities or defects in the layers and features that are out of specification with respect to the overall design for the workpiece fabrication. The corrective process control of block 958 may be provided to one or more of the processing steps or processing modules and it may be applied to one or more processing steps that are previous in time (upstream) to the capture of the measurement data 950 or may be applied to one or more of the process steps to follow (downstream) the capture of the measurement data 950 within the overall substrate fabrication according to the desirable design. The active interdiction control system 922, and its processes as indicated by blocks 954, 956 and 958 may be incorporated in software run by one or more computers of the control system 922 and/or components of that system.

In accordance with embodiments of the invention, the inspection systems for obtaining measurement data engage the workpiece by performing contact measurement or metrology or non-contact measurement or metrology depending on the attribute measured or the type of measurement. A combination of both contact and non-contact measurement might be used. Depending on the location of the inspection system, portions of the inspection system may be positioned partially or entirely inside an internal space or chamber of a module. In the embodiment of FIG. 9A as disclosed herein, dedicated measurement modules 916 may entirely contain the inspection system. Alternatively, a portion of a measurement module might be positioned inside of an internal space of a chamber, such as inside an internal space of a workpiece transfer module, with another portion of the measurement module located outside of the chamber. Such an embodiment is illustrated in FIG. 9D for example wherein a transfer measurement module is illustrated using a measurement region located within a dedicated area of the transfer chamber internal space and the inspection system is configured for engaging a workpiece positioned in the measurement region for measuring data associated with an attribute on the workpiece.

Support mechanism 938 or transfer mechanism 914 holding workpiece 936 may be translated and rotated to provide measurements of various areas on the workpiece 936. In that way, measurement data may be captured at various portions or segments of the entire workpiece. Thus, continuous measurements or point-by-point measurements are possible thereby reducing the overall measurement time and processing time.

For example, the inspection system measures data over a portion of the workpiece that is equal to or exceeding 1 square centimeter. Alternatively, the inspection system measures or images a substantive portion of the workpiece that is equal to or exceeding 90% of the working surface area of the workpiece. As noted, the inspection system may perform a measurement at plural discrete locations on the working surface of the workpiece or may perform a continuous sequence of measurements across a portion of the workpiece. For example, the inspection system may perform a measurement along a path extending across or partially across the workpiece. Such a path may include a line, a sequence of lines, an arc, a circular curve, a spiral curve, an Archimedean spiral, a logarithmic spiral, a golden spiral, or some combination thereof. Also, there may be several inspection systems wherein source/detector pairs 932, 940 may each represent a different inspection signal from a different inspection system and may be different forms of signals. For example, one source/detector pair 932, 940 might use an optical signal while another source/detector pair 932, 940 might use an electromagnetic signal, depending on the inspection system.

The inspection system(s) can perform multiple measurements of attributes on a workpiece while the workpiece is in a measurement module or in dedicated area of a transfer measurement module as discussed herein. The measurements may be made simultaneously in time. That is, different inspection systems might make measurements at the same time. Alternatively, the various inspection systems might operate at different times. For example, it may be necessary to move or position the workpiece in one position for one type of measurement or inspection system, and then move or position the workpiece for another measurement by the same or a different type of inspection system.

The inspection system(s) may be non-contact systems for providing non-contact measurement and metrology. Alternatively, one or more inspection systems of a measurement module or transfer measurement module might use a contact sensor that may be moved and positioned at a surface of the workpiece to make a measurement. The inspection systems provided in accordance with the invention may incorporate a combination of contact inspection systems and non-contact inspection systems for gathering measurement data associated with an attribute of the workpiece.

As described above, the inspection system as implemented in a measurement module or in a transfer measurement module may be stationary while the support mechanism or workpiece transfer mechanism moves the workpiece to engage with the inspection system and to take measurements in different areas of the workpiece. Alternatively, the inspection system 930, or some portion thereof, is movable with respect to the workpiece support mechanism 938, the workpiece transfer mechanism 914 and the module. The inspection system might be configured to translate and/or rotate with respect to the stationary workpiece to obtain measurement data from areas of the workpiece.

In other embodiments of the invention, the inspection system may be embedded in or part of a workpiece support mechanism. The inspection system 930 might be mounted or supported on the support mechanism 938. Then, when the workpiece is positioned on the support mechanism, it will be in a proper position for engagement by the inspection system. An inspection system 930 might be embedded in the support mechanism so as to sit below or otherwise proximate to a positioned workpiece to provide measurement data associated with a mass measurement or a temperature measurement of the workpiece, for example.

FIG. 9C illustrates a common manufacturing platform 900' incorporating a transfer module 910' in accordance with one embodiment the invention that utilizes a dedicated area to form a measurement region wherein measurement data may be gathered from a workpiece during transit. In that way, as noted herein, the workpiece can be processed and measured while remaining within a controlled environment, such as a vacuum environment. The workpiece does not need to leave the environment of the platform 900' for determining how the process is proceeding and for detecting any non-conformities or defects. Accordingly, the embodiment as illustrated in FIG. 9C forms a transfer measurement module (TMM) that may be utilized with one or more processing modules or as part of a common manufacturing platform. Furthermore, multiple transfer measurement modules may be utilized and interfaced together to cooperate and form a larger common manufacturing platform.

The inspection systems incorporated within a transfer measurement module (TMM) operate in and are similar to other inspection systems as described herein. Such inspection systems as illustrated in FIG. 9D, for example, only illustrate certain inspection systems. However, other inspection systems and features, such as those discussed above, would also be applicable to the transfer mechanism module is illustrated in FIG. 9C. As such, some common reference numerals are utilized in FIGS. 9C-9D as previously discussed herein.

The platform 900' incorporates a workpiece transfer module 910' that provides measurement/metrology data. The transfer measurement module (TMM) 910' includes a workpiece transfer mechanism, such as in the form of a handling robot 914 within the internal space of a transfer chamber 913. The transfer mechanism 914 is operable as in platform 900 to move one or more or more workpieces through the transfer module 910' and between various of the processing modules that are coupled to transfer module 910' in the common manufacturing platform. In accordance with one feature of the invention, transfer chamber 913 defines an internal space that includes a dedicated area that is used for measurement. The measurement region 915 of the TMM 910' is located in the dedicated area. The measurement region/area 915 is proximate to one or more inspection systems 930 for measurement.

More specifically, the measurement region 915 is positioned within the transfer chamber 913 so as to not interfere with the primary purpose of the transfer measurement module in moving workpieces through the process sequence and into and out of various processing modules. The measurement region defines one or more positions for placement of a workpiece for measurement. To that end, one or more inspection systems are configured to engage a workpiece that is positioned in the measurement region of the transfer chamber 913. The inspection system is then operable for measuring data associated with an attribute on the workpiece in accordance with the invention. As noted with the inspection systems disclosed herein, a support mechanism might be located within the measurement region 915 for supporting a workpiece during the collection of measurement data by the inspection system. Alternatively, the transfer mechanism 914 may provide the positioning and support of the workpiece within the measurement region 915 of the transfer chamber. In accordance with embodiments of the invention, the workpiece can be moved into or through the measurement region 915 during a processing sequence to obtain measurement data from one or more inspection systems that are associated with that measurement region. While a single measurement region is illustrated in FIG. 9C for illustrative purposes, multiple measurement regions 915 might be incorporated into the TMM 910'.

Referring to FIG. 9D, the TMM module 710' incorporates one or more inspection systems 930 located within a measurement region 915 and provides the ability to obtain real-time measurements and measurement data during a processing sequence. In one embodiment, measurement region 915 within the TMM 910' incorporates a support mechanism 938 that receives a workpiece from mechanism 914 for measurement inside chamber 913. Measurement data is captured as the workpiece is moved between processing modules. As discussed above, alternatively, the transfer mechanism or robot 914 might actually act as a support mechanism for moving the workpiece with respect to the inspection system 930 in the TMM 910'. Still further, the inspection system 930 in the TMM 910' might also incorporate a stationary workpiece wherein the inspection system 930 itself moves. Similarly, the inspection system 930 might be incorporated as part of or embedded with the support mechanism.

The measurement module or inspection system 930 may be entirely contained in the TMM 910' to make measurements. In other embodiments, a least a portion of the measurement module or inspection system is positioned inside of an internal space of the TMM 910' so as to define a measurement region within a dedicated area of the internal space as shown in FIG. 9D, while other portions may reside outside the TMM 910'. More specifically, measurement region 915 is defined and is located within a dedicated area of the internal space of the transfer chamber 913. The signal source and signal detector elements of inspection system 930 may be located externally of the transfer chamber internal space 913 while the workpiece support mechanism 938 and transfer mechanism 914 for supporting a workpiece 936 are contained within the transfer chamber 913. To that end, the inspection signals 934 pass through an appropriate access port 942 that is effectively transparent to the passage of the inspection signal 934 from the inspection system 930 and into the internal space 913 to engage workpiece 936 positioned in the measurement region 915. As noted, the inspection signal 934 might include an electromagnetic signal, an optical signal, a particle beam, a charged particle beam, or some combination of such signals. The access port 942 may be appropriately formed to operate with a specific inspection system and the sources of the inspection signal. For example, the access port 942 might include a window, an opening, a valve, a shutter, and iris, or some combination of different structures for forming the access port in order to allow incident inspection signals to engage the workpiece 936. To that end, at least a portion of the inspection system 930 might be located generally above a top surface of the transfer chamber 913.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of self-aligned multi-patterning on a semiconductor workpiece using an integrated sequence of processing steps executed on a common manufacturing platform hosting a plurality of processing modules including one or more film-forming modules, one or more etching modules, a plurality of transfer modules, and an inspection system comprising one or more measurement devices provided only within the transfer modules, the integrated sequence of processing steps including:
   receiving a workpiece into the common manufacturing platform, the workpiece having a mandrel pattern formed thereon comprising a plurality of first features separated by a first pitch distance; and
   using the one or more film-forming modules and the one or more etching modules, forming a sidewall spacer pattern based, at least in part, on the mandrel pattern, the sidewall spacer pattern comprising a plurality of second features separated by a second pitch distance with the first pitch distance being greater than the second pitch distance, wherein:
   the integrated sequence of processing steps is executed in a controlled environment within the common manufacturing platform and without leaving the controlled environment,
   the plurality of transfer modules are used to transfer the workpiece between the plurality of processing modules while maintaining the workpiece within the controlled environment,
   each of the transfer modules is configured to transfer the workpiece to a different one of the plurality of processing modules,
   the one or more measurement devices are configured to perform measurements on the workpiece to obtain measurement data related to the forming of the sidewall spacer pattern, and
   none of the measurement devices is provided within any of the processing modules.

2. The method of claim 1, further comprising:
   based on the measurement data, determining whether a thickness, width, or profile of the sidewall spacer pattern meets a target condition.

3. The method of claim 2, wherein the plurality of processing modules includes a correction module, the method further comprising:
   when the thickness, width, or profile of the sidewall spacer pattern is determined to not meet the target condition, processing the workpiece in the correction module to alter the sidewall spacer pattern.

4. The method of claim 2, wherein the plurality of transfer modules further include a workpiece measurement region located within a dedicated area of at least one of the plurality of transfer modules, and wherein the obtaining measurement data is performed during at least one of the transfers of the workpiece between the plurality of processing modules by passing the workpiece into the workpiece measurement region.

5. The method of claim 2, wherein the common manufacturing platform includes one or more metrology modules, and wherein the obtaining measurement data is performed by transferring the workpiece into the metrology module between one or more of the processing steps of the integrated sequence of processing steps.

6. The method of claim 2, further comprising:
   using an intelligence system hosted on the common manufacturing platform, controlling the integrated sequence of processing steps executed on the common manufacturing platform based on the obtained measurement data.

7. The method of claim 1, wherein forming the sidewall spacer pattern includes a self-aligned double patterning process, a self-aligned triple patterning process, a self-aligned quadruple patterning process, or a self-aligned octuple patterning process.

8. A method of processing materials on a semiconductor workpiece, comprising an integrated sequence of processing steps including:
   receiving a workpiece into a common manufacturing platform, the workpiece having a mandrel pattern formed thereon comprising a number of mandrel lines;
   conformally applying a first thin film over the mandrel pattern using a first film-forming module hosted on the common manufacturing platform;
   without breaking vacuum, removing the first thin film from upper surfaces of the mandrel pattern and lower surfaces adjacent the mandrel pattern using a first etching module hosted on the common manufacturing platform to leave behind the first thin film on sidewalls of the mandrel pattern thereby forming first sidewall spacers;
   without breaking vacuum, removing the mandrel pattern from the workpiece using a second etching module hosted on the common manufacturing platform to leave behind the first sidewall spacers to thereby form a new feature pattern comprising a number of features that is double the number of mandrel lines; and
   without breaking vacuum, obtaining measurement data related to one or more attributes of the workpiece, wherein:
   the common manufacturing platform includes a plurality of transfer modules for transferring the workpiece between the first film-forming module, the first etching module, and the second etching module without breaking vacuum,
   each of the plurality of transfer modules is configured to transfer the workpiece to a different module among the first film-forming module, the first etching module, and the second etching module, the measurement data is obtained by at least one measurement device provided only within the transfer modules, and none of the measurement data is obtained within any of the first film-forming module, the first etching module, and the second etching module.

9. The method of claim 8, further comprising:

based on the measurement data, determining whether the one or more attributes meets a target condition.

10. The method of claim 9, wherein the one or more attributes includes attributes of the mandrel pattern of the workpiece as received into the common manufacturing platform, attributes of an underlying layer of the workpiece as received into the common manufacturing platform, attributes of the first thin film as conformally applied, attributes of the mandrel pattern after conformally applying the first thin film, attributes of the underlying layer after conformally applying the first thin film, attributes of the sidewall spacers on the sidewalls of the mandrel pattern after removing the first thin film, attributes of the mandrel pattern after removing the first thin film, attributes of the underlying layer after removing the first thin film, attributes of the sidewall spacers after removing the mandrel pattern, or attributes of the underlying layer after removing the mandrel pattern.

11. The method of claim 10, wherein the plurality of processing modules includes a correction module, the method further comprising:

when the one or more attributes is determined to not meet the target condition, processing the workpiece in the correction module to alter the one or more attributes.

12. The method of claim 11, wherein the obtained measurement data is used to determine a defectivity, a film conformality, a thickness, a uniformity, and/or a selectivity of the new feature pattern formation on the workpiece and wherein the processing the workpiece in the correction module comprises:

repairing the conformally applied first thin film when the one or more attributes of the first thin film does not meet the target condition for the first thin film;

repairing the first sidewall spacers when the one or more attributes of the first sidewall spacers does not meet the target condition for the first sidewall spacers.

13. The method of claim 9, wherein the common manufacturing platform includes a metrology module, the metrology module including at least one optical source for directing a diagnostic beam incident on a measurement surface of the workpiece, and at least one detector arranged to receive a diagnostic signal scattered from the measurement surface of the workpiece, the integrated sequence of processing steps further comprising:

without breaking vacuum, transferring the workpiece into the metrology module and obtaining the measurement data related to the one or more attributes of the workpiece, wherein the measurement data is obtained between one or more of the processing steps of the integrated sequence of processing steps.

14. The method of claim 9, wherein the plurality of transfer modules further include a workpiece measurement region located within a dedicated area of at least one of the plurality of transfer modules, the integrated sequence of processing steps further comprising:

without breaking vacuum, passing the workpiece into the workpiece measurement region and obtaining the measurement data related to the one or more attributes of the workpiece, wherein the measurement data is obtained between one or more of the processing steps of the integrated sequence of processing steps.

15. The method of claim 14, wherein the measurement data is obtained after each of the processing steps of the integrated sequence of processing steps, and wherein the plurality of processing modules includes a correction module, the method further comprising:

when the measurement data obtained after one of the processing steps indicates that the one or more attributes does not meet the target condition, processing the workpiece in the correction module to alter the one or more attributes prior to performing a next processing step in the integrated sequence of processing steps.

16. The method of claim 15, the integrated sequence of processing steps further comprising:

without breaking vacuum, conformally applying a second thin film over the new feature pattern using a second film-forming module hosted on the common manufacturing platform;

without breaking vacuum, removing the second thin film from upper surfaces of the new feature pattern and lower surfaces adjacent the new feature pattern using a third etching module hosted on the common manufacturing platform to leave behind the second thin film on sidewalls of the new feature pattern thereby forming second sidewall spacers; and without breaking vacuum, removing the new feature pattern from the workpiece using a fourth etching module hosted on the common manufacturing platform to leave behind the second sidewall spacers, the number of second sidewall spacers being quadruple the number of mandrel lines.

17. The method of claim 15, the integrated sequence of processing steps further comprising:

using the plurality of transfer modules, transferring the workpiece between the first film-forming module, the first etching module, and the second etching module in a second sequential pass without breaking vacuum and without exiting the common manufacturing platform to conformally apply a second thin film over the new feature pattern, remove the second thin film from upper surfaces of the new feature pattern and lower surfaces adjacent the new feature pattern to leave behind the second thin film on sidewalls of the new feature pattern thereby forming second sidewall spacers, and remove the new feature pattern from the workpiece to leave behind the second sidewall spacers, the number of second sidewall spacers being quadruple the number of mandrel lines.

18. A method of processing materials on a semiconductor workpiece, comprising an integrated sequence of processing steps including:

receiving a workpiece into a common manufacturing platform, the workpiece having a mandrel pattern formed thereon comprising a number of mandrel lines;

conformally applying a first thin film over the mandrel pattern using a first film-forming module hosted on the common manufacturing platform;

without breaking vacuum, removing the first thin film from upper surfaces of the mandrel pattern and lower surfaces adjacent the mandrel pattern using a first etching module hosted on the common manufacturing platform to leave behind the first thin film on sidewalls of the mandrel pattern thereby forming first sidewall spacers;

without breaking vacuum, conformally applying a second thin film over the first sidewall spacers and mandrel pattern in a second film-forming module hosted on the common manufacturing platform;

without breaking vacuum, removing the second thin film from upper surfaces of the first sidewall spacers and mandrel pattern and lower surfaces adjacent the first sidewall spacers in a second etching module hosted on the common manufacturing platform to leave behind the second thin film on sidewalls of the first sidewall spacers thereby forming second sidewall spacers;

without breaking vacuum, removing the first sidewall spacers from the workpiece using a third etching module hosted on the common manufacturing platform to leave behind the second sidewall spacers and mandrel pattern and to thereby form a new feature pattern comprising a number of features that is triple the number of mandrel lines, wherein the common manufacturing platform includes a plurality of transfer modules for transferring the workpiece between the first film-forming module, the second film-forming module, the first etching module, the second etching module, and the third etching module without breaking vacuum, each of the plurality of transfer modules is configured to transfer the workpiece to a different module among the first film-forming module, the first etching module, the second etching module and the third etching module, the plurality of transfer modules further include a workpiece measurement region located within a dedicated area of at least one of the plurality of transfer modules, the integrated sequence of processing steps further comprising, without breaking vacuum, passing the workpiece into the workpiece measurement region and obtaining measurement data related to one or more attributes of the workpiece and, based on the measurement data, determining whether the one or more attributes meets a target condition, wherein the measurement data is obtained between one or more of the processing steps of the integrated sequence of processing steps, and none of the measurement data is obtained within any of the first film-forming module, the second film-forming module, the first etching module, the second etching module, and the third etching module.

19. The method of claim 18, wherein the measurement data is obtained after each of the processing steps of the integrated sequence of processing steps, and wherein the plurality of processing modules includes a correction module, the method further comprising:

when the measurement data obtained after one of the processing steps indicates that the one or more attributes does not meet the target condition, processing the workpiece in the correction module to alter the one or more attributes prior to performing a next processing step in the integrated sequence of processing steps.

* * * * *